United States Patent
Seo et al.

(10) Patent No.: US 10,401,982 B2
(45) Date of Patent: Sep. 3, 2019

(54) ELECTRONIC DEVICE INCLUDING INPUT MODULE

(71) Applicant: Samsung Electronics Co., Ltd., Gyeonggi-do (KR)

(72) Inventors: Bo-Woong Seo, Gyeongsangbuk-do (KR); Min-Soo Kim, Gyeongsangbuk-do (KR); Jin-Wan An, Daegu (KR); Ji-Woo Lee, Gyeongsangbuk-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/721,037

(22) Filed: Sep. 29, 2017

(65) Prior Publication Data

US 2018/0088690 A1    Mar. 29, 2018

(30) Foreign Application Priority Data

Sep. 29, 2016 (KR) .................. 10-2016-0125918

(51) Int. Cl.
*G06F 3/0354* (2013.01)
*G06F 1/16* (2006.01)
*G06F 3/041* (2006.01)
*G06F 3/046* (2006.01)
(Continued)

(52) U.S. Cl.
CPC ......... *G06F 3/03545* (2013.01); *G01R 33/02* (2013.01); *G01R 33/07* (2013.01);
(Continued)

(58) Field of Classification Search
CPC .... G06F 3/03545; G06F 3/046; G06F 3/0418; G06F 3/0416; G06F 3/044; G06F 1/1643; G06F 1/1656; G06F 1/1686; G01R 33/07; G01R 33/02; H01F 7/0294; H01F 1/0302
See application file for complete search history.

(56) References Cited

U.S. PATENT DOCUMENTS 6,310,472 B1 * 10/2001 Chass ............... G01D 5/142
324/207.17
6,681,333 B1 * 1/2004 Cho ................. G06F 1/1626
345/179
(Continued)

FOREIGN PATENT DOCUMENTS

EP  2 072 443   6/2009
EP  2 784 623   10/2014
(Continued)

OTHER PUBLICATIONS

International Search Report dated Dec. 18, 2017 issued in counterpart application No. PCT/KR2017/010644, 10 pages.

*Primary Examiner* — Mihir K Rayan
(74) *Attorney, Agent, or Firm* — The Farrell Law Firm, P.C.

(57) ABSTRACT

An electronic device is provided. The electronic device includes a housing including at least one receiving hole exposed to an outside, a magnet disposed inside the housing and adjacent to the at least one receiving hole, an input module configured to be insertable into the at least one receiving hole and including a ferrite core configured to block or redirect part of a magnetic field generated from the magnet, a sensor unit disposed inside the housing and configured to sense the magnetic field generated from the magnet, and a controller configured to sense whether the input module is inserted into the at least one receiving hole by a signal according to a strength of the magnetic field sensed by the sensor unit.

20 Claims, 15 Drawing Sheets

(51) Int. Cl.
*G06F 3/044* (2006.01)
*H01F 1/03* (2006.01)
*H01F 7/02* (2006.01)
*G01R 33/02* (2006.01)
*G01R 33/07* (2006.01)

(52) U.S. Cl.
CPC ............ *G06F 1/169* (2013.01); *G06F 1/1643* (2013.01); *G06F 1/1656* (2013.01); *G06F 3/044* (2013.01); *G06F 3/046* (2013.01); *G06F 3/0416* (2013.01); *G06F 3/0418* (2013.01); *H01F 1/0302* (2013.01); *H01F 7/0294* (2013.01); *G06F 1/1686* (2013.01)

(56) References Cited

U.S. PATENT DOCUMENTS

2002/0190823 A1* 12/2002 Yap ...................... G06F 1/1616
                                                         335/205
2004/0135765 A1    7/2004 Kinerk et al.
2009/0167295 A1*  7/2009 Chen ...................... G01C 17/30
                                                         324/202
2014/0015783 A1*  1/2014 Jeon ........................ G06F 3/038
                                                         345/173
2014/0099153 A1    4/2014 Pemberton-Pigott
2014/0180481 A1*  6/2014 Park ...................... G06F 3/0487
                                                         700/275
2016/0109968 A1*  4/2016 Roh .................... G06F 3/03545
                                                         345/173
2016/0162049 A1*  6/2016 Horie ........................ G06F 3/03
                                                         345/179
2016/0352383 A1* 12/2016 Richmond ........... H04B 1/3888

FOREIGN PATENT DOCUMENTS

KR    10-2012-0119352    10/2012
KR    10-2014-0055507     5/2014

* cited by examiner

ELECTRONIC DEVICE INCLUDING INPUT MODULE

PRIORITY

This application claims priority under 35 U.S.C. § 119(a) to a Korean Patent Application filed on Sep. 29, 2016 in the Korean Intellectual Property Office and assigned Serial No. 10-2016-0125918, the entire disclosure of which is incorporated herein by reference.

BACKGROUND

1. Field of the Disclosure

The present disclosure relates generally to modules detachably coupled to electronic devices, and more particularly, to devices capable of sensing insertion of a module into an electronic device.

2. Description of the Related Art

Typically, a portable terminal refers to a device that can be carried by a user, allowing him or her to enjoy telecommunication, such as a voice call or short messaging services, multimedia functionality, such as playing music or video, or other entertainment functions, such as playing video games. Portable terminals come in various types depending on their specified functions and portability. For example, portable terminals may be classified into bar types, clamshell types, and slider types. As more emphasis is placed on multimedia functionality, portable terminals come with a larger display. As electronic devices become more integrated, and high-volume, high-speed wireless communication technology becomes commonplace, various functions are being integrated into a single portable terminal, e.g., a mobile communication terminal.

In addition, some portable terminals may be more finely controlled with a separate input module, e.g., a stylus pen. A portable terminal may be configured to receive a stylus pen. A camera module may be detachably provided in a portable terminal, allowing the internal space of the portable terminal to be used in a more efficient way.

For conventional portable terminals to be equipped with detachable modules, e.g., an input module, a switch is provided in the portable terminal to sense the input module, and a hole is formed in the input module to contact the switch. The provision of the switch may reduce the internal space of the portable terminal. Further, the hole of the input module and the switch may become worn or damaged due to frequent contact therebetween.

SUMMARY

An aspect of the present disclosure provides an electronic device including an input module that includes no physical switch, leading to an increase in the internal space for equipping other parts. Further, no parts of the electronic device are exposed to the outside, providing efficient waterproofing.

Another aspect of the present disclosure provides an electronic device including an input module may sense a variation in magnetic field according to the correlation between a ferrite core in the input module and a magnet in the electronic device, allowing one to check if the input module is inserted into the electronic device in an effective way.

According to an aspect of the present disclosure, an electronic device is provided. The electronic device includes a housing including at least one receiving hole exposed to an outside, a magnet disposed inside the housing and adjacent to the at least one receiving hole, an input module configured to be insertable into the at least one receiving hole and including a ferrite core to block or redirect part of a magnetic field generated from the magnet, a sensor unit disposed inside the housing and configured to sense the magnetic field generated from the magnet, and a controller configured to sense whether the input module is inserted into the at least one receiving hole by a signal according to a strength of the magnetic field sensed by the sensor unit.

According to another aspect of the present disclosure, an electronic device including an input module is provided. The electronic device includes a receiving hole formed in a side of a housing, the input module configured to be insertable into the receiving hole and working with a magnetic field inside the housing to generate a varied magnetic field, a sensor unit configured to sense a strength of the varied magnetic field delivered from a ferrite core, and a controller configured to control an active state of the input module corresponding to a signal sensed from the sensor unit.

BRIEF DESCRIPTION OF THE DRAWINGS

The above and other aspects, features, and advantages of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
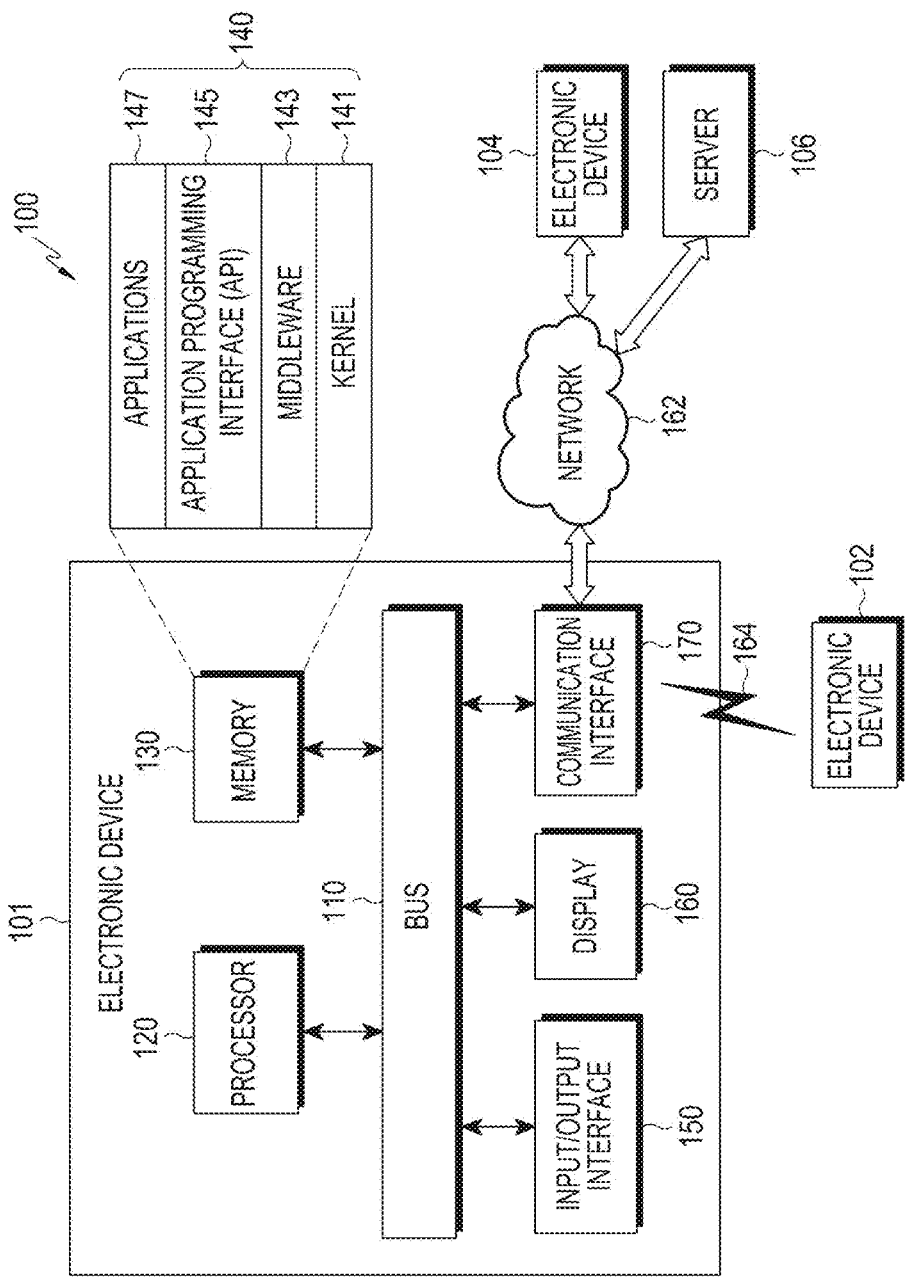
FIG. 1 is a block diagram of an electronic device in a network environment according to an embodiment of the present disclosure.

Hereinafter, embodiments of the present disclosure are described with reference to the accompanying drawings. However, it should be appreciated that the present disclosure is not intended to be limited to the embodiments and the terminology used herein, but includes all changes and/or equivalents or replacements thereto within the scope of the appended claims and their equivalents. The same or similar reference numerals may be used to refer to the same or similar elements throughout the present disclosure and the accompanying drawings. It is to be understood that the singular forms "a," "an," and "the" include plural references unless the context clearly dictates otherwise. As used herein, the terms "A or B" and "at least one of A and/or B" may include all possible combinations of A and B. As used herein, the terms "first" and "second" may modify various components regardless of importance and/or order and are used to distinguish a component from another without limiting the components. It will be understood that when an element (e.g., a first element) is referred to as being (operatively or communicatively) "coupled with/to," or "connected with/to" another element (e.g., a second element), it can be coupled or connected with/to the other element directly or via a third element.

As used herein, the expression "configured to" may be interchangeably used with other expressions, such as "suitable for," "capable of," "modified to," "made to," "adapted to," "able to," or "designed to" in hardware or software within context. In addition, the expression "configured to" may indicate that a device can perform an operation together with another device or parts. For example, the expression "processor configured (or set) to perform A, B, and C" may indicate a general purpose processor (e.g., a central processing unit (CPU) or an application processor (AP)) that may perform the operations by executing one or more software programs stored in a memory device or a dedicated processor (e.g., an embedded processor) for performing the operations.

For example, an electronic device according to an embodiment of the present disclosure may include at least one of a smartphone, a tablet personal computer (PC), a mobile phone, a video phone, an electronic book (e-book) reader, a desktop PC, a laptop computer, a netbook computer, a workstation, a server, a personal digital assistant (PDA), a portable multimedia player (PMP), a moving picture experts group audio layer 3 (MP3) player, a medical device, a camera, or a wearable device. The wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device. In an embodiment of the present disclosure, examples of a smart home appliance may include at least one of a television, a digital video disk (DVD) player, an audio player, a refrigerator, an air conditioner, a cleaner, an oven, a microwave oven, a washer, a drier, an air cleaner, a set-top box, a home automation control panel, a security control panel, a TV box (e.g., Samsung HomeSync®, Apple TV®, or Google TV™), a gaming console (Xbox®, PlayStation®), an electronic dictionary, an electronic key, a camcorder, or an electronic picture frame.

According to an embodiment of the present disclosure, an electronic device may include at least one of various medical devices (e.g., diverse portable medical measuring devices (a blood sugar level measuring device, a heartbeat measuring device, or a thermometer), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, a sailing electronic device (e.g., a sailing navigation device or a gyro compass), avionics, security devices, vehicular head units, industrial or home robots, drones, automated teller machines (ATMs), point of sales (POS) devices, or Internet of Things (IoT) devices (e.g., a light bulb, various sensors, a sprinkler, a fire alarm, a thermostat, a street light, a toaster, fitness equipment, a hot water tank, a heater, or a boiler).

According to an embodiment of the present disclosure, examples of the electronic device may include at least one of part of a piece of furniture, building/structure or vehicle, an electronic board, an electronic signature receiving device, a projector, or various measurement devices (e.g., devices for measuring water, electricity, gas, or electromagnetic waves). The electronic device may be flexible or may be a combination of the above-enumerated electronic devices. However, the electronic devices are not intended to be limited to those described above. As used herein, the term "user" may denote a human or another device (e.g., an artificial intelligence electronic device) using an electronic device.

FIG. 1 is a block diagram of an electronic device 101 in a network environment 100 according to an embodiment of the present disclosure.

Referring to FIG. 1, the electronic device 101 is included in a network environment 100. The electronic device 101 may include a bus 110, a processor 120, a memory 130, an input/output interface 150, a display 160, and a communication interface 170. The electronic device 100 may exclude at least one of the components or may include another component. The bus 110 may include a circuit for connecting the components 110 to 170 with one another and transferring communications (e.g., control messages or data) between the components 110 to 170. The processing 120 may include one or more of a CPU, an, or a communication processor (CP). The processor 120 may perform control on at least one of the other components 110 to 170 of the electronic device 101, and/or perform an operation or process data relating to communication.

The memory 130 may include a volatile and/or non-volatile memory. For example, the memory 130 may store commands or data related to at least one other component of the electronic device 101. According to an embodiment of the present disclosure, the memory 130 may store software and/or a program 140. The program 140 may include, e.g., a kernel 141, middleware 143, an application programming interface (API) 145, and/or an application program (or applications) 147. At least a portion of the kernel 141, middleware 143, or API 145 may be denoted as an operating system (OS). For example, the kernel 141 may control or manage system resources (e.g., the bus 110, the processor 120, or the memory 130) used to perform operations or functions implemented in other programs (e.g., the middleware 143, the API 145, or the application program 147). The kernel 141 may provide an interface that allows the middleware 143, the API 145, and the application program 147 to access the individual components of the electronic device 101 to control or manage the system resources.

The middleware 143 may function as a relay to allow the API 145 or the application program 147 to communicate data with the kernel 141, for example. Further, the middleware 143 may process one or more task requests received from the application program 147 in order of priority. For example, the middleware 143 may assign a priority of using system resources (e.g., the bus 110, the processor 120, or the memory 130) of the electronic device 101 to at least one of the application program 147 and process one or more task requests. The API 145 is an interface allowing the application program 147 to control functions provided from the kernel 141 or the middleware 143. For example, the API 145 may include at least one interface or function (e.g., a command) for filing control, window control, image processing or text control. For example, the input/output interface 150 may transfer commands or data input from the user or other external device to other component(s) of the electronic device 101 or may output commands or data received from other component(s) of the electronic device 101 to the user or other external devices.

The display 160 may include, e.g., a liquid crystal display (LCD), a light emitting diode (LED) display, an organic LED (OLED) display, a microelectromechanical systems (MEMS) display, or an electronic paper display. The display 160 may display, e.g., various contents (e.g., text, images, videos, icons, or symbols) to the user. The display 160 may include a touchscreen and may receive, e.g., a touch, a gesture, a proximity or hovering input using an electronic pen or a portion of a body of a user. For example, the communication interface 170 may set up communication between the electronic device 101 and a first electronic device 102, a second electronic device 104, or a server 106. For example, the communication interface 170 may be connected with the network 162 through wireless or wired communication to communicate with the external electronic device.

The wireless communication may include cellular communication which uses at least one of, e.g., long term evolution (LTE), LTE advanced (LTE-A), code division multiple access (CDMA), wideband code division multiple access (WCDMA), universal mobile telecommunication system (UMTS), wireless broadband (WiBro), or global system for mobile communication (GSM). According to an embodiment of the present disclosure, the wireless communication may include at least one of, e.g., wireless fidelity (Wi-Fi), Bluetooth, Bluetooth low power (BLE), Zigbee, near field communication (NFC), magnetic secure transmission (MST), radio frequency (RF), or body area network (BAN). Wireless communication may include GNSS. GNSS may be, e.g., global positioning system (GPS), global navigation satellite system (Glonass), Beidou navigation satellite system (Beidou) or the European global satellite-based navigation system (Galileo). Hereinafter, the terms "GPS" and "GNSS" may be used interchangeably. The wired connection may include at least one of, e.g., a universal serial bus (USB), a high definition multimedia interface (HDMI), recommended standard (RS)-232, power line communication (PLC), or plain old telephone service (POTS). The network 162 may include at least one of telecommunication networks, e.g., a computer network (e.g., a local area network (LAN) or a wide area network (WAN)), the Internet, or a telephone network.

The first electronic device 102 and the second electronic device 104 may each be a device of the same or a different type from the electronic device 101. According to an embodiment of the present disclosure, all or some of the operations executed on the electronic device 101 may be executed on the electronic device 102, the electronic device 104, or the server 106. When the electronic device 101 should perform some function or service automatically or by request, the electronic device 101, instead of executing the function or service on its own or additionally, may request the electronic device 102, the electronic device 104, or the server 106 to perform at least some functions associated therewith. The electronic device 102, the electronic device 104, or the server 106 may execute the requested functions or additional functions and transfer a result of the execution to the electronic device 101. The electronic device 101 may provide a requested function or service by processing the received result as is or additionally. To that end, a cloud computing, a distributed computing, or a client-server computing technique may be used, for example.

Figure 2A:
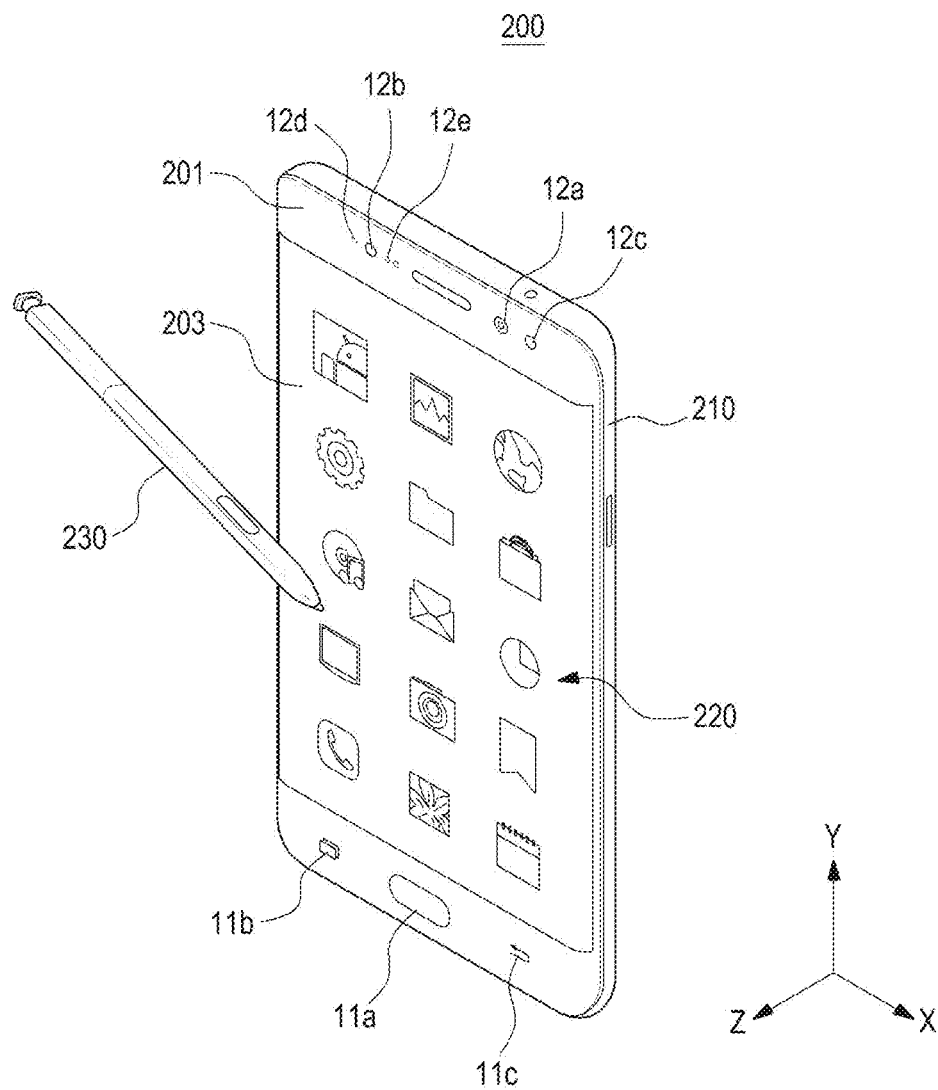
FIG. 2A is a perspective view of an electronic device according to an embodiment of the present disclosure.
Figure 2B:
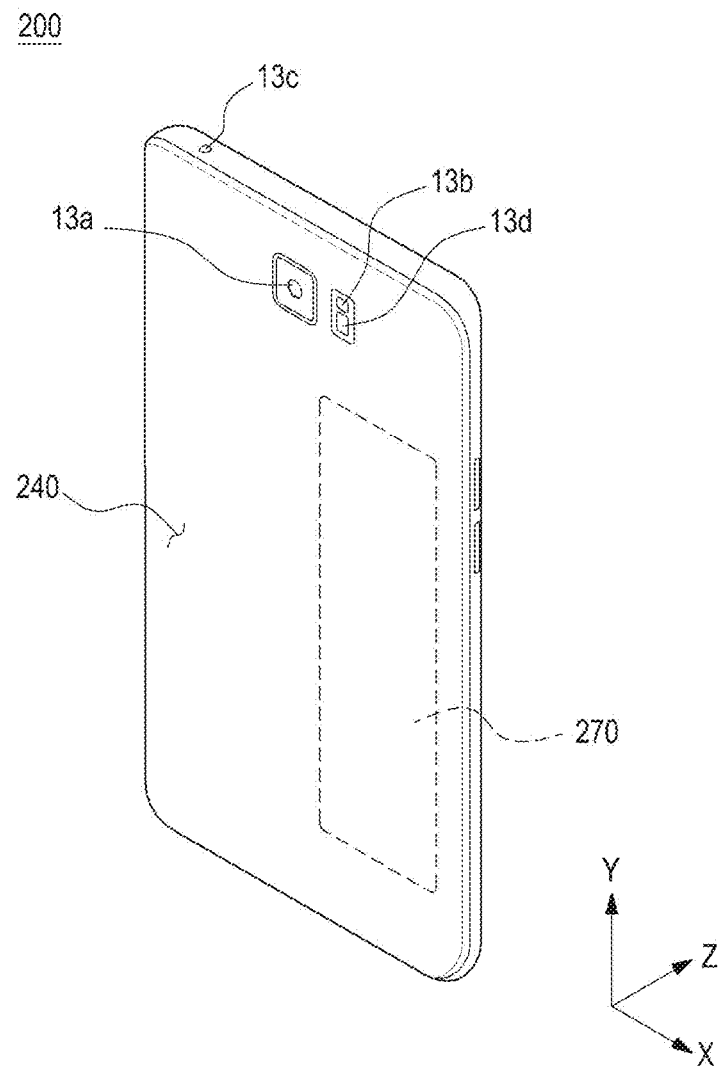
FIG. 2B is a perspective view of an electronic device according to an embodiment of the present disclosure.

FIG. 2A is a perspective view of an electronic device 200 according to an embodiment of the present disclosure. FIG. 2B is a perspective view of the electronic device 200 according to an embodiment of the present disclosure, where the electronic device 200 FIG. 2B is viewed from a different direction than in FIG. 2A.

Referring to FIGS. 2A and 2B, "X," "Y," and "Z" in the rectangular coordinate system may denote the width, the length, and the thickness of the electronic device 200, respectively. According to an embodiment of the present disclosure, "X" may denote a first direction (+X or −X), "Y" may denote a second direction (+Y or −Y), and "Z" may denote a third direction (+Z or −Z).

The electronic device 200 may include a housing 210 and a display device 220. The housing 210 may have a front opening. A transparent cover 203 may be provided to form at least part of the front surface 201 of the housing 210, closing the front opening of the front surface 210 of the housing 201. The electronic device 200 may have a keypad in a side area of the transparent cover 203 on the front surface 201 of the housing 210. The keypad may include buttons or touch keys 11a, 11b, and 11c that are operated mechanically. The touch keys may generate input signals as they are touched by a part of a user's body. According to an embodiment of the present disclosure, the keypad may be implemented to include only mechanical buttons or only touch keys. For example, the keypad may be implemented in a mixed type of the mechanical button type and the touch type. The keypad may provide various screens on the display device corresponding to a shorter or longer press or touch on the buttons. The keypad may include a home button (e.g., touch key 11a), and the touch key 11a may be referred to as the home button. The home button 11a may be configured as a mechanical button that generates an input signal by a user's physical press or as a touch button that generates an input signal by the user's contact, e.g., a touch. For example, the home button 11a may be implemented in a mixed type of the mechanical button type and the touch button type.

Various circuit devices, e.g., the processor 120, the memory 130, the input/output interface 150, and the communication interface 170 of FIG. 1, may be included in the housing 210. A battery 270 may also be included in the housing 210 to secure power.

According to an embodiment of the present disclosure, the electronic device 200 is configured to receive or house an input module 230 that may be a stylus pen. The input module 230 may be guided and inserted into a receiving hole formed in the electronic device 200 or may also be removed therefrom.

According to an embodiment of the present disclosure, a first camera 12a, a light source unit 12b, or an iris camera 12c may be provided in an upper area of the front surface of the electronic device 200. For example, the light source unit 12b may be an infrared (IR) LED. The iris camera 12c may take an image of a user's eye using, as a light source, near infrared light emitted from the IR LED, thereby recognizing iris information. For example, a light source unit indication lamp 12d, and an illuminance sensor or proximity sensor 12e may be included in the upper area of the front surface of the electronic device 200. For example, a second camera 13a, a heart rate sensor (or heart rate monitor (HRM)) 13d or a flash 13b may be provided on the rear surface of the electronic device 200. A microphone 13c may be provided in an upper portion of the electronic device 200.

Figure 3:
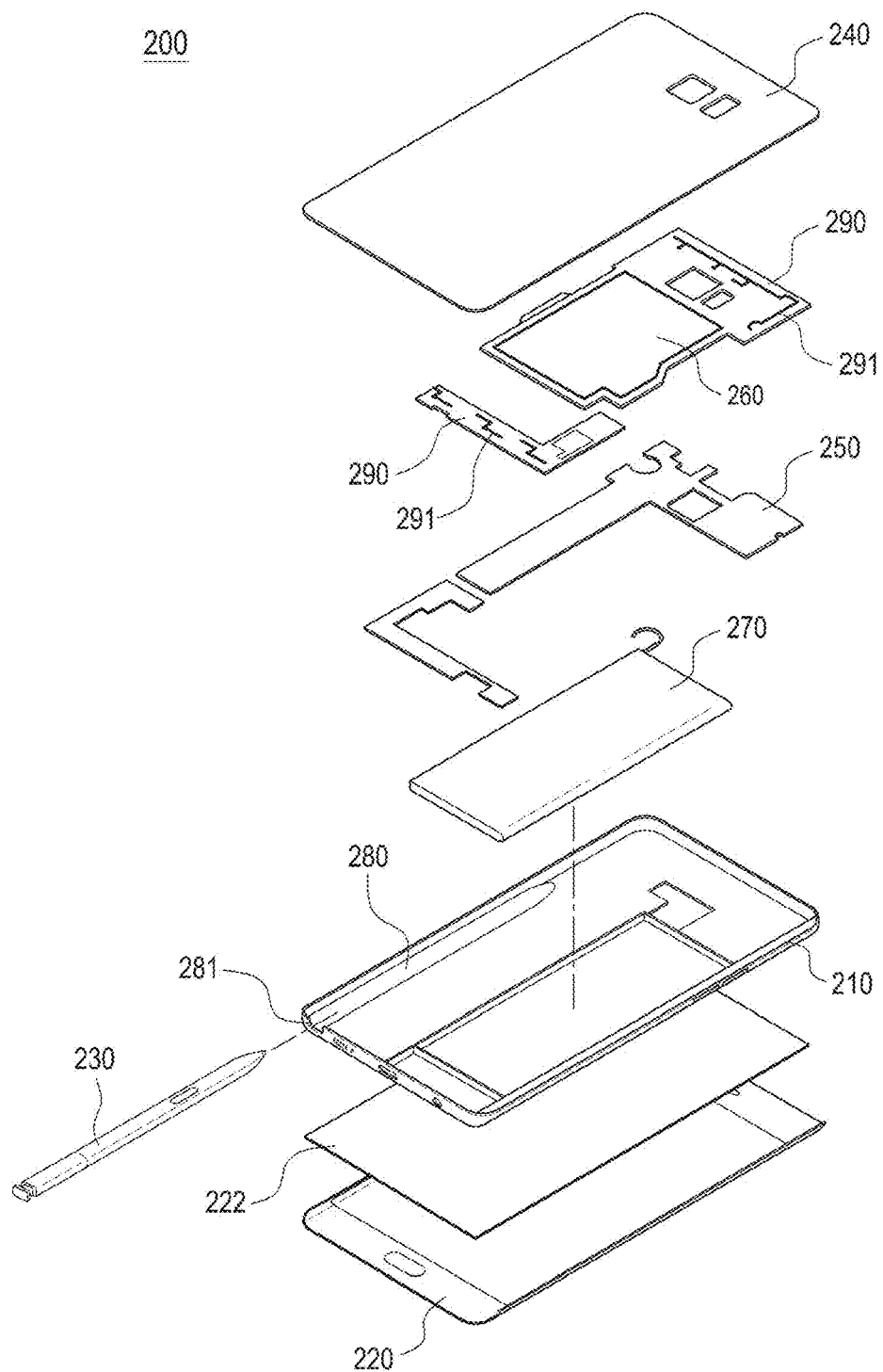
FIG. 3 is an exploded view of an electronic device according to an embodiment of the present disclosure.
Figure 4:
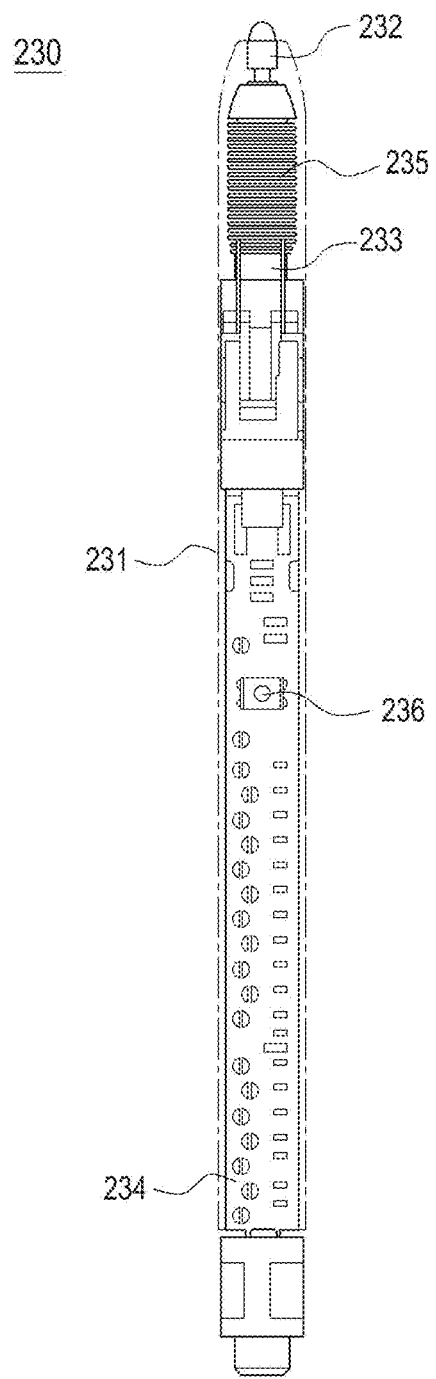
FIG. 4 is an illustration of an input module insertable into a housing of an electronic device according to an embodiment of the present disclosure.

FIG. 3 is an exploded view of the electronic device 200 according to an embodiment of the present disclosure. FIG. 4 is an illustration of an input module 230 insertable into a housing 210 of an electronic device according to an embodiment of the present disclosure.

Referring to FIGS. 3 and 4, the electronic device 200 may include a housing 210, a display device 220, a printed circuit board 250 and an input module 230 insertable into the inside of the housing 210.

The housing 210 may be an element for receiving various electronic parts. At least part of the housing 210 may be formed of a conductive material. For example, the housing 210 may have side walls that form outer side surfaces of the electronic device 200. Portions of the housing 210, which are exposed to the outside of the electronic device 200, may be formed of a metal. The printed circuit board 250 and/or a battery 270 may be received inside the housing 210. For example, a processor, a communication module, various interfaces (e.g., the input interface 150 and the communication interface 170 of FIG. 1), and a power management module may be mounted on the printed circuit board 250 in the form of an integrated circuit (IC) or chip. A control circuit may also be configured in a chip that may be mounted on the printed circuit board 250. For example, the control circuit may be part of the processor or the communication module.

According to an embodiment of the present disclosure, the display device 220 may be exposed through the front surface of the housing 210. The display device 220 may be, at least partly, formed of a material that transmits radio waves or magnetic fields. The display device 220 may be mounted on the front surface of the housing 210. The display device 220 may include a window member formed of reinforced glass and a display panel placed on an inner side surface of the window member. A touch panel may be provided between the window member and the display panel. For example, the display device 220 may be utilized as an input device equipped with touchscreen functionality, not alone as an output device for outputting screen. The display device 220 may include a separate digitizer panel 222, as an input panel, on the rear surface of the display panel. The digitizer panel 222 may detect handwriting that is made by the input module 230 while communicating with the electronic device 200 in a wired or wireless manner, and the digitizer panel 222 may deliver the detected handwriting to the electronic device 200. The digitizer panel 222 may be formed of a flexible panel that is foldable or rollable for portability. For example, the digitizer panel 222, as an input panel, may generate an electromagnetic field when an alternating current (AC) is applied. When a user brings the input module 230 close or in contact with the display device 220 including the digitizer panel 222, the electromagnetic field generated by the digitizer panel 222 may induce a secondary current across an induction coil of the input module 230. As the secondary current is induced across the induction coil, the input module 230 may generate a secondary electromagnetic field through the circuit unit in the input module. When handwriting is made using the input module 230 which generates the secondary electromagnetic field, the digitizer panel 222 may convert the handwriting into an electronic file by detecting the movement trajectory of the input module 230.

According to an embodiment of the present disclosure, the electronic device 200 may include a rear cover 240 to protect the rear surface of the housing 210. The rear cover 240 is mounted to face the display device 220, i.e., in the opposite direction of the display device 220. The rear cover 240 may be formed of a material capable of transmitting radio waves or magnetic fields, e.g., reinforced glass or synthetic resin. The rear cover, along with the display device 220, may configure an outer appearance of the electronic device 200.

According to an embodiment of the present disclosure, the housing 210 may include a hole 281 for guiding the input module 230 and a receiving hole 280 for receiving the input module 230.

According to an embodiment of the present disclosure, various structures may be formed on the surface of the housing 210 depending on the arrangement of electronic parts inside the electronic device 200 or connections within the housing 210. For example, spaces for receiving IC chips mounted on the printed circuit board 250 may be formed in the housing 210. The spaces for the IC chips may be formed in recessed shapes or ribs surrounding the IC chips.

According to an embodiment of the present disclosure, the electronic device 200 may include an antenna unit 260 having a conductive pattern and a radiating conductor unit 290. The antenna unit 260 may be disposed between the printed circuit board 250 and the rear cover 240. A magnetic field generated by the conductive pattern of the antenna unit 260 or a radio wave transmitted or received through the conductive pattern of the antenna unit 260 may be transmitted through the plate, e.g., the rear cover 240.

According to an embodiment of the present disclosure, a surface of the antenna unit 260 may include a film formed of an insulator or dielectric material and may provide an area for forming the conductive pattern(s). For example, the antenna unit 260 including the conductive pattern may be shaped as a flexible printed circuit board as viewed from the outside. Alternatively, the antenna unit 260 may be a flexible printed circuit board in a multi-layer circuit board structure. For example, the conductive pattern(s) may be disposed on one surface, or its opposite surface, of the antenna unit 260. When the antenna unit 260 has a multi-layer circuit board structure, a plurality of conductive patterns may be formed on appropriate ones of the layers constituting the antenna unit 260. For example, the conductive patterns may be formed by, e.g., printing, deposition, coating, and/or plating, and part of the conductive layer formed in the antenna layer 260 may be formed by etching (e.g., wet etching or dry etching). The conductive pattern(s) may form a loop antenna. Where a loop antenna is a part of a flexible printed circuit board, a plurality of loop antennas for communication may be included in a single flexible printed circuit board. An antenna formed of at least one flexible printed circuit board may include an NFC, an MST, or wireless power consortium (WPC) loop antenna.

According to an embodiment of the present disclosure, the radiating conductor unit 290 is disposed between the printed circuit board 250 and the rear cover 240. Radiating conductors 291 arranged inside the radiating conductor unit 290 may be part of an internal structure formed by laser direct structuring (LDS). The radiating conductor 291 may transmit or receive radio waves or generate magnetic fields.

According to an embodiment of the present disclosure, the input module 230 may be inserted into the receiving hole 280 of the housing 210. The input module 230 may include a stylus pen 230. The stylus pen 230 may be utilized as an additional device for controlling the touch panel. Generally, the touch panel may sense the approach or touch of a part of a user's body, e.g., his/her finger. The stylus pen 230 may be utilized to make a sophisticated input, e.g., handwriting or a sketch. Moisture, which may be left on the touch panel, may be utilized to drive the display. The stylus pen 230 itself may carry a tiny current from a user's body to the touch panel, generating an input signal. The stylus pen 230 may be equipped with a separate resonance circuit, interworking with the digitizer panel mounted in the electronic device 200.

According to an embodiment of the present disclosure, the stylus pen 230 may include a body 231 for receiving the resonance circuit unit 234, a tip 232 of the body 231, a ferrite core 233 and an induction coil 235 positioned adjacent to the tip 232 inside the body 231. The ferrite core 233 may be magnetized by a magnetic field that is generated by a magnet disposed inside the electronic device 200, corresponding to whether the body 231 is inserted into the receiving hole 280.

According to an embodiment of the present disclosure, the resonance circuit unit 234 may be connected with the induction coil 235 that is connected to a reactance device, such as a capacitive device that has variable capacitance. The induction coil 235 may be a coil wound around the outer circumferential surface of the ferrite core 233 which is disposed inside the input module 230. The induction coil 235 forms an inductive current by external power or electromagnetic field. The input module 230 may form a secondary electromagnetic field by the resonance circuit unit 234 connected with the induction coil 235 and the reactance device having variable reactance.

For example, the input module 230 may further include a second and third reactance device that are disposed in the resonance circuit unit 234. The second and third reactance device may also be connected with the induction coil 235 to reinforce the resonance frequency, e.g., the secondary electromagnetic field, of the resonance circuit unit 234.

According to an embodiment of the present disclosure, one of the first and second reactance devices may be connected to the induction coil 235 by way of a switch member 236 that is disposed on the body 231. The switch member 236 may be manipulated by a user. The frequency of the resonance circuit unit 234 may be varied temporarily at the moment that the switch member 236 is manipulated. A click operation may be implemented by such temporary variation in the resonance frequency.

A configuration for sensing whether an input module, e.g. a stylus pen, is stably received inside an electronic device will now be described.

Figures 5A, 5B:
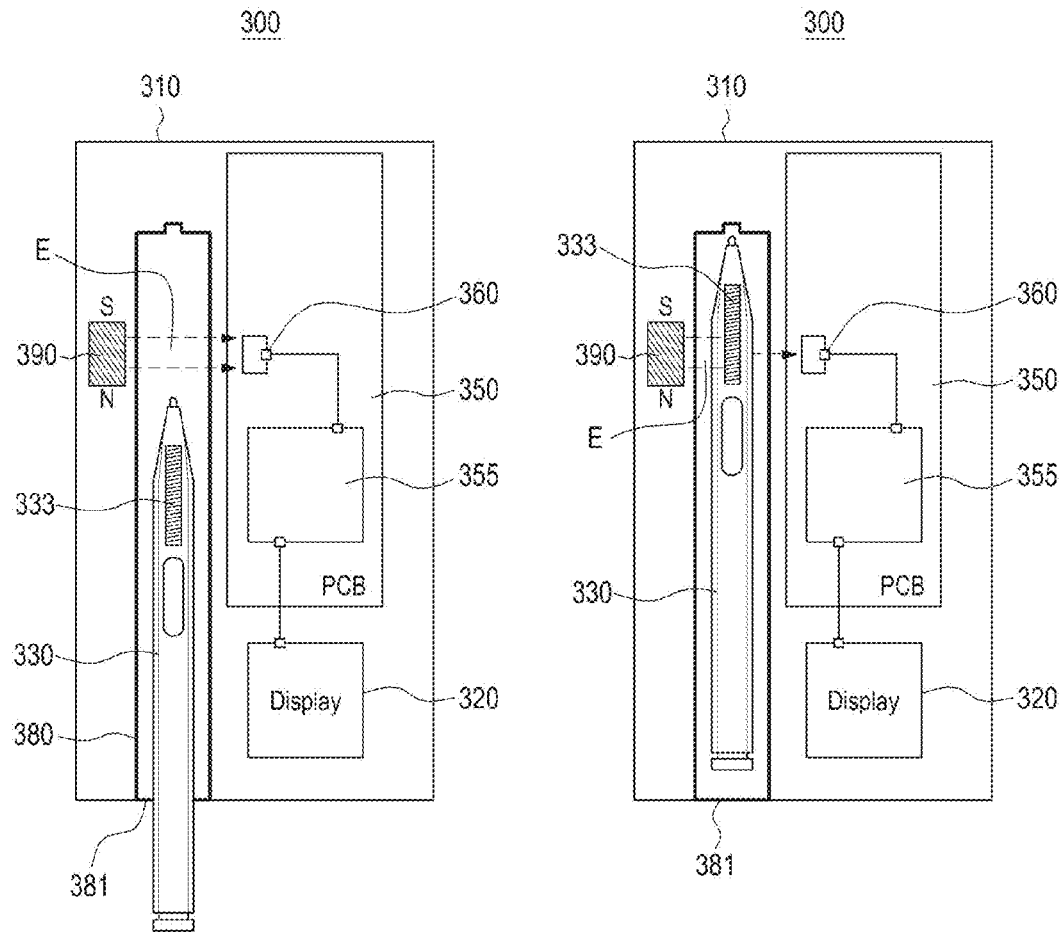
FIGS. 5A and 5B are illustrations of recognizing insertion of an input module into a housing of an electronic device according to an embodiment of the present disclosure.

FIGS. 5A and 5B are illustrations of recognizing insertion of an input module 330 into a housing 310 of an electronic device according to an embodiment of the present disclosure.

Referring to FIGS. 5A and 5B, FIG. 5A shows a state (not seated in position yet) of the input module 330 being inserted into the housing 310, and FIG. 5B shows a state of the input module 330 being fully received in the housing 310.

The electronic device 300 may include the housing 310 including at least one receiving hole 380, a magnet 390, and a sensor unit 360 arranged inside the housing 310 and mounted adjacent to the receiving hole 380. The electronic device 300 may also include the input module 330 that may be inserted and mounted through the receiving hole 380 in the housing 310. According to an embodiment of the present disclosure, the input module 330 may be a stylus pen.

The housing 310, a printed circuit part 350, and the input module 330 of the electronic device 300 shown in FIGS. 5A and 5B may be the housing 210, the printed circuit board 250, and the input module 230, respectively, of FIGS. 2A, 2B, and 3.

According to an embodiment of the present disclosure, the housing 310 may include an opening 381 exposed to the outside and the receiving hole 380 disposed in a lengthwise direction. The receiving hole 380 may provide a space for receiving the input module 330. For example, the receiving hole 380 may be configured in a shape corresponding to the shape of the input module 330, stably receiving the input module 330 in the internal space of the housing. A waterproof structure may be provided around the receiving hole 380, which has been designed to seal a waterproof material to block a path along which moisture is introduced into the inside of the housing 310. The internal circuit unit of the housing 310 may be coated with a waterproof material, e.g., epoxy, along its outer surface, to be waterproofed.

According to an embodiment of the present disclosure, the magnet 390 may be utilized as a means to sense whether the input module 330 is received or not. For example, the housing 310 may embed a sensor (e.g., a Hall effect sensor) for sensing a magnetic field E. The sensor may sense whether the input module 330 is received or not by sensing the magnetic field E which is formed by the magnet 390.

According to an embodiment of the present disclosure, the magnet 390 may be disposed at a side of the receiving hole 380. For example, the magnet 390 may be disposed in a position facing a ferrite core 333 embedded in the input module 330, with the input module 330 completely received in the receiving hole 380 of the housing 310. For example, the magnet 390 is positioned so that, when the input module 330 is placed in position inside the receiving hole, its south (or S) pole is directed towards a front end portion of the input module 330 and its north (or N) pole is directed towards a rear end portion of the input module 330. However, the present disclosure is not limited to such a structure. For example, the N pole of the magnet 390 may be positioned towards the front end portion of the input module while the S pole of the magnet 390 may be positioned towards the rear end portion of the input module depending on the direction and strength of the magnetic field that is delivered to the ferrite core 333 and the sensor unit 360.

According to an embodiment of the present disclosure, the electronic device 300 may include the sensor unit 360 electrically connected with the printed circuit part 350. The sensor unit 360 may be a Hall effect sensor and/or a geo-magnetic sensor. The sensor unit 360 may be disposed in a position corresponding to the magnet 390 with respect to the receiving hole 380. For example, the sensor unit 360 may be mounted in a position facing the magnet 390. As the sensor unit 360 senses a magnetic field E generated by the magnet 390, whether the input module 330 is received or not may be detected. Information detected through the sensor unit 360 may be delivered to the printed circuit part 350.

An example in which the sensor unit 360 performs recognition depending on whether the input module 330 is seated inside the receiving hole 380 is described in more detail below.

FIG. 5A shows a state of the input module 330 being inserted but not fully received inside the receiving hole 380 of the housing 310. The magnet 390 is positioned facing the sensor unit 360, with the receiving hole 380 disposed therebetween. The magnet 390 may generate a magnetic field E and deliver the magnetic field E to the sensor unit 360. For example, the path of high-density magnetic flux lines which are generated from the magnet 390 may directly be formed towards the sensor unit 360. In this case, a high strength of magnetic field E may be formed around the sensor unit 360, and the sensor unit 360 may sense the magnetic field E and output a first signal. Information about the first signal outputted from the sensor unit 360 may be transferred to the printed circuit part 350. The controller 355 of the electronic device 300 may recognize, based on the first signal, that the input module 330 is not in a normal position inside the receiving hole 380 and determine whether the electronic device 300 operates. For example, the controller 355 may keep or switch the mode of the electronic device 300 and/or the input module 330 into an active state so that entry to the display device 320 may be made by the input module 330. For example, the controller 355 may provide an alarm to notify a user whether the input module 330 is normally received or removed from the receiving hole 380.

FIG. 5B shows a state of the input module 330 being completely inserted into the receiving hole 380 of the housing 310. The magnet 390 is positioned facing the sensor unit 360 with the receiving hole 380 with the input module 330 disposed therebetween inside the receiving hole 380 in which case a magnetic field E generated by the magnet 390 may be delivered to the sensor unit 360 while being partially blocked by the ferrite core 333 in the input module 330.

For example, the ferrite core 333 may absorb (or be magnetized by) the magnetic field E generated by the magnet 390. The direction and strength of the magnetic field E may be varied depending on the length of the ferrite core 333. Accordingly, a low-density magnetic flux line may be induced from a high-density magnetic flux line by the magnetized ferrite core 333, and the induced magnetic field E may be transferred to the sensor unit 360. A reduced density of magnetic field E may be formed around the sensor unit 360. The sensor unit 360 may sense the reduced density of magnetic field or fail to sense a magnetic field that has disappeared, outputting a second signal. The second signal may be of a relatively high output as compared with the first signal.

Information about the second signal outputted from the sensor unit 360 may be transferred to the printed circuit part 350. The controller 355 of the electronic device 300 may recognize, based on the second signal, that the input module 330 is normally received in the receiving hole 380 and determine whether the electronic device 300 operates. For example, the controller 355 may keep or switch the mode of the electronic device 300 and/or the input module 330 into an inactive state so that entry to the display device 320 may not be made by the input module 330.

Figure 6:
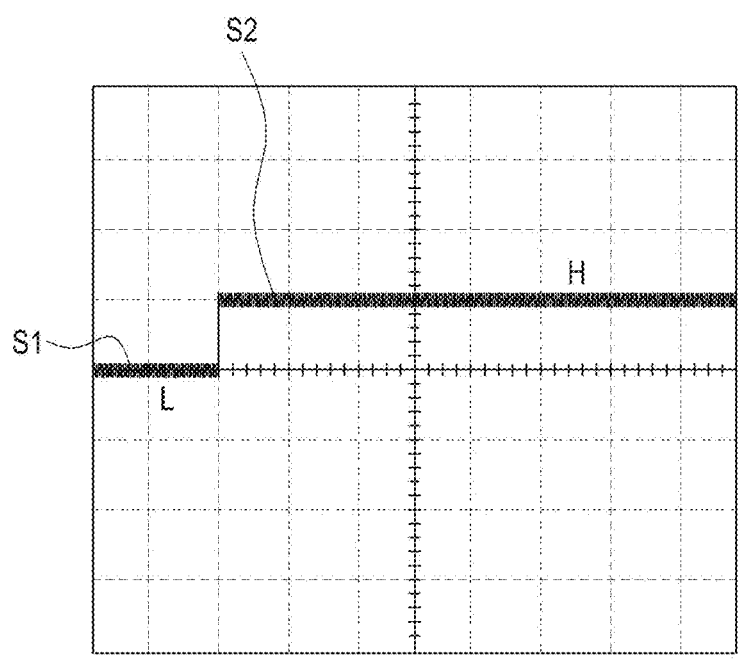
FIG. 6 is a graph of a signal output from a sensor unit depending on insertion of an input module into a receiving hole as shown in FIGS. 5A and 5B.

FIG. 6 is a graph of a signal output from the sensor unit 360 depending on insertion of the input module 330 into the receiving hole 380 as shown in FIGS. 5A and 5B.

Referring to FIG. 6, a process may be identified in which an output signal from the sensor unit 360 is converted from a first signal S1 to a second signal S2. For example, the first signal S1 may be a signal of a wavelength generated in the state shown in FIG. 5A, and the second signal S2 may be a signal of a wavelength generated in the state shown in FIG. 5B.

According to an embodiment of the present disclosure, a magnetic field E generated from the magnet 390 may be delivered to the sensor unit 360 without other external influence (refer to FIG. 5A). Accordingly, the magnetic field E which has not been changed in strength and/or direction may be directly delivered to the sensor unit 360, and the first signal S1 may accordingly be outputted. The first signal S1 may be a relatively low-output signal as compared with the second signal S2. However, the strength of the signal is not limited thereto. For example, the first signal S1 may be controlled to be relatively high as compared with the second signal S2 depending on the settings of the sensor unit 360.

According to an embodiment of the present disclosure, a magnetic field E generated from the magnet 390 may be magnetized by the ferrite core 333 disposed inside the input module 330, and the magnetic field E with the varied strength may then be transferred to the sensor unit 360 (refer to FIG. 5B). Thus, a magnetic field E having a lower density of magnetic flux lines than that generated from the magnet 390 may be delivered to the sensor unit 360, and the second signal S2 may thus be outputted. The second signal S2 may be a relatively high-output signal as compared with the first signal S1. However, the strength of the signal is not limited thereto. For example, the second signal S2 may be controlled to be relatively low as compared with the first signal S1 depending on the settings of the sensor unit 360.

Figures 7A, 7B:
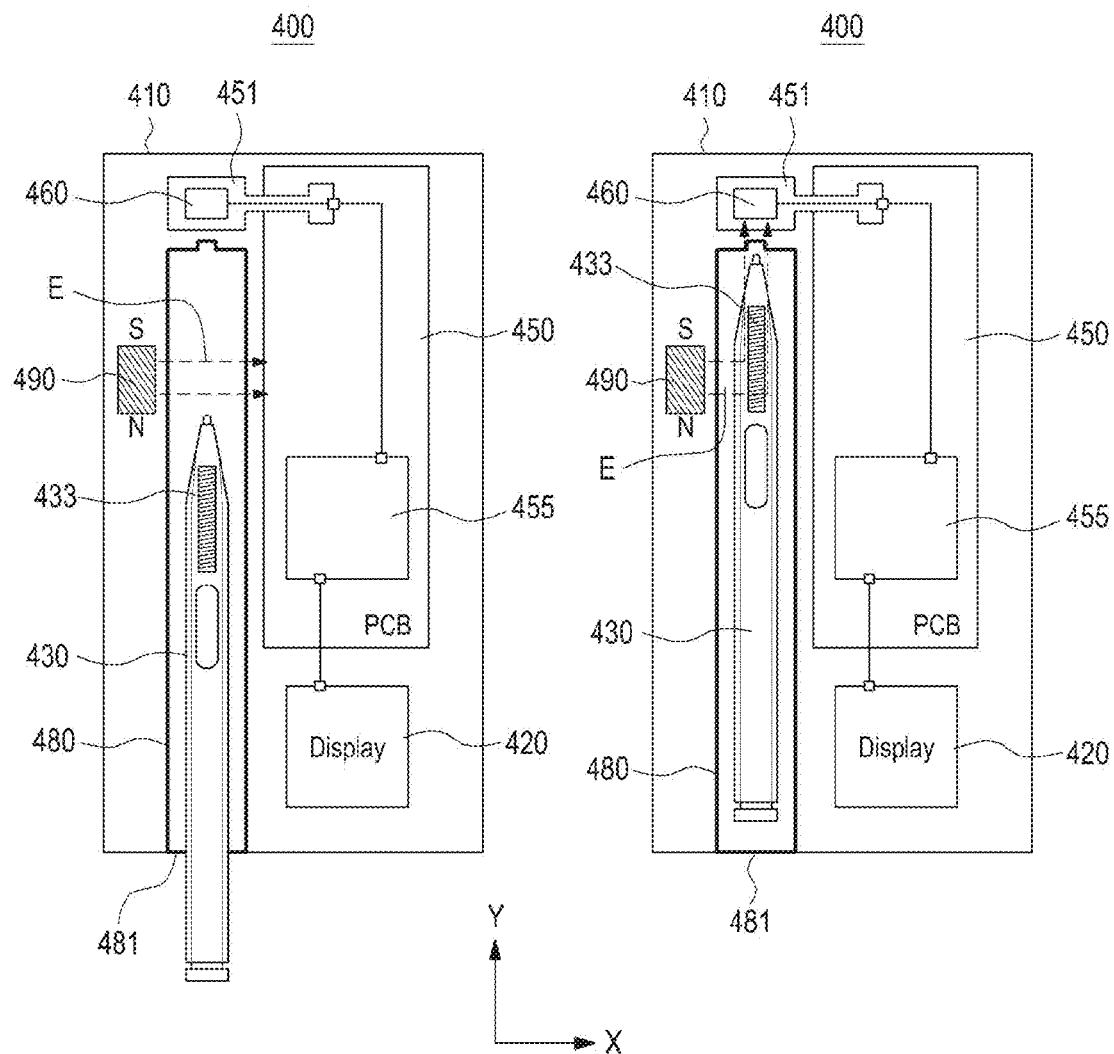
FIGS. 7A and 7B are illustrations of recognizing insertion of an input module into a housing of an electronic device according to an embodiment of the present disclosure.

FIGS. 7A and 7B are illustrations of recognizing insertion of an input module 430 into a housing 410 of an electronic device 400 according to an embodiment of the present disclosure.

Referring to FIGS. 7A and 7B, FIG. 7A shows a state (not seated in position yet) of the input module 430 being inserted into the housing 410, and FIG. 7B shows a state of the input module 430 being fully received in the housing 410.

The electronic device 400 may include the housing 410 including at least one receiving hole 480, a magnet 490 and a sensor unit 460 arranged inside the housing 410 and mounted adjacent to the receiving hole 480, and an input module 430 that may be inserted and placed in the receiving hole 480 of the housing 410. According to an embodiment of the present disclosure, the input module 430 may be a stylus pen.

According to an embodiment of the present disclosure, the housing 410, a printed circuit part 450, and the input module 430 of FIGS. 7A and 7B may be the housing 210, the printed circuit board 250, and the input module 230, respectively, of FIGS. 2A, 2B, and 3.

According to an embodiment of the present disclosure, the housing 410 may include an opening 481 exposed to the outside and the receiving hole 480 disposed in a lengthwise direction. The receiving hole 480 may provide a space for receiving the input module 430.

According to an embodiment of the present disclosure, the magnet 490 may be utilized as a means to sense whether the input module 430 is received or not. For example, the housing 410 may embed a sensor (e.g., a Hall effect sensor) for sensing a magnetic field E. The sensor may sense whether the input module 430 is received or not by sensing the magnetic field E which is formed by the magnet 490. The magnet 490 may be disposed at a side of the receiving hole 480. For example, the magnet 490 may be disposed in a position facing a ferrite core 433 embedded in the input module 430, with the input module 430 completely received in the receiving hole 480 of the housing 410.

According to an embodiment of the present disclosure, the electronic device 400 may include the sensor unit 460 electrically connected with the printed circuit part 450. The sensor unit 460 may directly be connected with the flexible printed circuit part 451 disposed to extend from a side of the printed circuit part 450. The sensor unit 460 may be a Hall effect sensor and/or a geo-magnetic sensor. The sensor unit 460 may be disposed in a direction different from the magnet 490 with respect to the receiving hole 480. For example, the sensor unit 460 may be disposed in a second direction Y with respect to the ferrite core 433, and the magnet 490 may be disposed in a first direction X different from the second direction Y with respect to the ferrite core 433, with the input module 430 fully received inside the receiving hole 480 of the housing 410. The first direction X may be perpendicular to the second direction Y. For example, the sensor unit 460 may be disposed on a path along which a magnetic field E generated from the magnet 490 propagates, sensing a signal of the magnetic field E. As the sensor unit 460 senses a magnetic field E generated by the magnet 490, whether the input module 430 is received or not may be detected. Information detected through the sensor unit 460 may be delivered to the printed circuit part 450.

An example in which the sensor unit 460 performs recognition depending on whether the input module 430 is seated inside the receiving hole 480 is described below in more detail.

FIG. 7A shows a state of the input module 430 being inserted but not fully received inside the receiving hole 480 of the housing 410. The magnet 490 is positioned facing in a different direction from that of the sensor unit 460, with the receiving hole 480 disposed therebetween. The magnet 490 may not be able to transfer the magnetic field E to the sensor unit 460. For example, a path of high-density magnetic flux lines from the magnet 490 is not directed towards the sensor unit 460 or some low-density magnetic flux lines may be delivered to the sensor unit 460. In this case, a very weak magnetic field E may be formed around the sensor unit 490 as compared with a magnetic field around the magnet 490, and the sensor unit 460 may sense the magnetic field E and output a third signal. Information about the third signal outputted from the sensor unit 460 may be transferred to the printed circuit part 450. The controller 455 of the electronic device 400 may recognize, based on the third signal, that the input module 430 is not in a normal position inside the receiving hole 480 and determine whether the electronic device 400 operates. For example, the controller 455 may keep or switch the mode of the electronic device 400 and/or the input module 430 into an active state so that entry to the display device 420 may be made by the input module 430. For example, the controller 455 may provide an alarm to notify the user whether the input module 430 is normally received or removed from the receiving hole 480.

FIG. 7B shows a state of the input module 430 being completely inserted into the receiving hole 480 of the housing 410. The magnet 490 and the sensor unit 460 are arranged in different directions from each other, with the input module 430 disposed therebetween inside the receiving hole 480. In this case, a magnetic field E generated from the magnet 490 may be delivered to the sensor unit 460 along a path of magnetic flux lines that have been changed by the ferrite core 433 inside the input module 430.

For example, the ferrite core 433 may redirect the magnetic field E generated from the magnet 490 along the lengthwise direction of the ferrite core 433. Thus, part of the magnetic field E redirected by the ferrite core 433 magnetized by the magnetic field E may be delivered to the sensor unit 460. In this case, a relatively strong magnetic field E may be formed around the sensor unit 460 as compared with the magnetic field E delivered to the sensor unit 460 as shown in FIG. 7A, and the sensor unit 460 may sense the high-density magnetic field E and output a fourth signal. The fourth signal may be of a relatively low output as compared with the third signal.

Information about the fourth signal outputted from the sensor unit 460 may be transferred to the printed circuit part 450. The controller 455 of the electronic device 400 may recognize, based on the fourth signal, that the input module 430 is normally received in the receiving hole 480 and determine whether the electronic device 400 operates. For example, the controller 455 may keep or switch the mode of the electronic device 400 and/or the input module 430 into an inactive state so that entry to the display device 320 may not be made by the input module 430.

Figure 8:
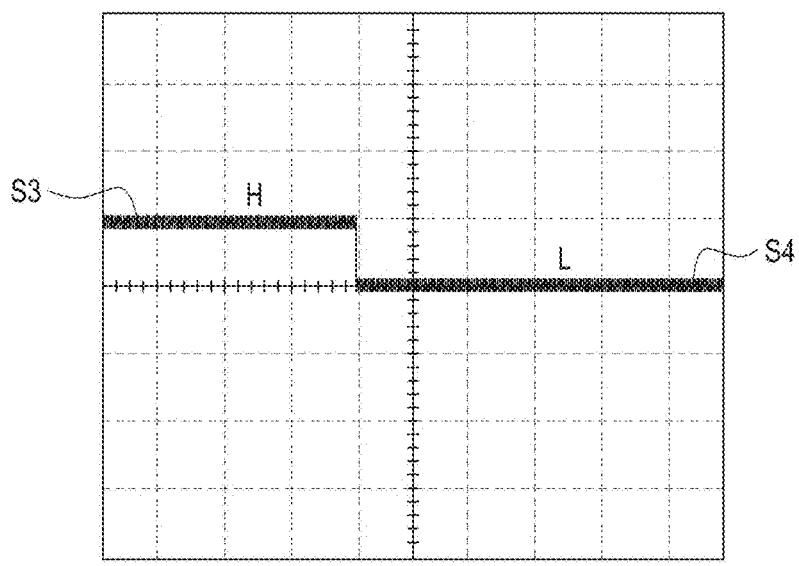
FIG. 8 is a graph of a signal output from a sensor unit depending on insertion of an input module into a receiving hole as shown in FIGS. 7A and 7B.

FIG. 8 is a graph of a signal output from the sensor unit 460 depending on insertion of the input module 430 into the receiving hole 480 as shown in FIGS. 7A and 7B.

Referring to FIG. 8, a process may be identified in which an output signal from the sensor unit 460 is converted from a third signal S3 to a fourth signal S4. For example, the third signal S3 may be a signal of a wavelength generated in the state shown in FIG. 7A, and the fourth signal S4 may be a signal of a wavelength generated in the state shown in FIG. 7B.

According to an embodiment of the present disclosure, the sensor unit 460 is not disposed on the path of the magnetic field E generated from the magnet 490, or the sensor unit 460 may be disposed on the path of weak magnetic flux lines of the magnetic field E (refer to FIG. 7A). Accordingly, no or a weak magnetic field E is delivered to the sensor unit 460, so that the sensor unit 460 may output the third signal S3. The third signal S3 may be a relatively high-output signal as compared with the fourth signal S4. However, the strength of the signal is not limited thereto. For example, the third signal S3 may be controlled to be relatively low as compared with the fourth signal S4 depending on the settings of the sensor unit 460.

According to an embodiment of the present disclosure, a magnetic field E generated from the magnet 490 may be magnetized by the ferrite core 433 disposed inside the input module 430, and the magnetic field E that has been redirected may then be transferred to the sensor unit 460 (refer to FIG. 7B). Thus, a magnetic field E having a higher density of magnetic flux lines than that shown in FIG. 7A may be delivered to the sensor unit 460, and the fourth signal S4 may thus be outputted. The fourth signal S4 may be a relatively low-output signal as compared with the third signal S3. However, the strength of the signal is not limited thereto. For example, the fourth signal S4 may be controlled to be relatively high as compared with the third signal S3 depending on the settings of the sensor unit 460.

Figures 9A, 9B:
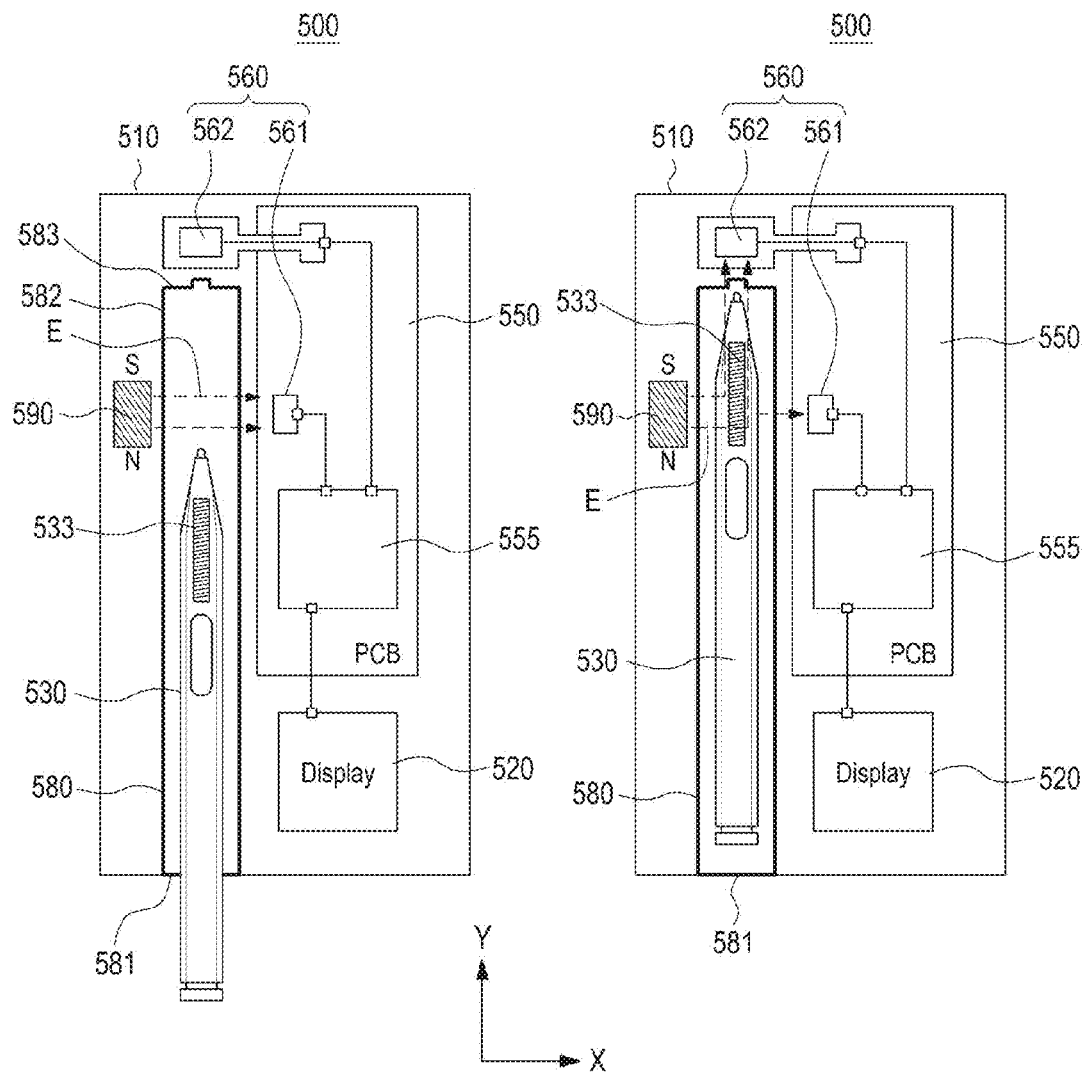
FIGS. 9A and 9B are illustrations of recognizing insertion of an input module into a housing of an electronic device according to an embodiment of the present disclosure.

FIGS. 9A and 9B are illustrations of recognizing insertion of an input module 530 into a housing 510 of an electronic device 500 according to an embodiment of the present disclosure.

Referring to FIGS. 9A and 9B, FIG. 9A shows a state (not seated in position yet) of the input module 530 being inserted into the housing 510, and FIG. 9B shows a state of the input module 530 being fully received in the housing 510.

The electronic device 500 may include the housing 510 including at least one receiving hole 580, a magnet 590 and a plurality of sensor units 560 arranged inside the housing 510 and mounted adjacent to the receiving hole 580, and an input module 530 that may be inserted and placed in the receiving hole 580 of the housing 510. According to an embodiment of the present disclosure, the input module 530 may be a stylus pen.

According to an embodiment of the present disclosure, the housing 510, the display device 520, a printed circuit part 550, the input module 530, the receiving hole 580 and the hole 581 of FIGS. 9A and 9B may be the housing 210, the display device 220, the printed circuit board 250, the input module 230, the receiving hole 280 and the hole 281 respectively, of FIGS. 2A, 2B, and 3. The configuration and description of the embodiments of FIGS. 5A, 5B, 7A, and 7B may apply to the embodiment of FIGS. 9A and 9B, and the differences are primarily described below.

According to an embodiment of the present disclosure, the receiving hole 580 may include a first surface 582 that is disposed in a lengthwise direction of the input module 530, e.g., a stylus pen, and a second surface 583 that is disposed in a direction of an end portion of the input module 530. The first surface 582 may be disposed perpendicular to the second surface 583. For example, the first surface 582 may be configured in a shape corresponding to the shape of the input module 530 and may form a cylindrical outer circumferential surface. For example, the second surface 583 may be configured in a shape corresponding to the shape of an end portion of the input module 530, and the second surface 583 may be formed to have a circular shape or to have a hole formed in the center of the circular shape to receive at least part of the end portion of the input module 530.

According to an embodiment of the present disclosure, the sensor units 560 may include a first sensor unit 561 and a second sensor unit 562. The first sensor unit 561 may be disposed facing the first surface 582 and in line with the magnet 590. The second sensor unit 562 may be disposed facing the second surface 583, and the second sensor unit 562 may have the same configuration as the first sensor unit 561. For example, the first sensor unit 561 and the second sensor unit 562 may sense different strengths of magnetic fields E to output different strengths of signals depending on whether the ferrite core 533 inside the input module 530 is seated on a side of the receiving hole 580.

An example in which the first and second sensor units 561 and 562 performs recognition depending on whether the input module 530 is seated inside the receiving hole 580 is described below.

FIG. 9A shows a state of the input module 530 being inserted but not fully received inside the receiving hole 580 of the housing 510. The first sensor unit 561 is disposed facing the magnet 590 with the receiving hole 580 disposed therebetween, and a magnetic field E generated from the magnet 590 may be delivered to the first sensor unit 561. For example, the magnetic field E generated from the magnet 590 may be formed so that the path of high-density magnetic flux lines is directed towards the first sensor unit 561. In this case, a strong magnetic field E may be generated around the first sensor unit 561, and the first sensor unit 561 may output a first signal.

The second sensor unit 562 is disposed perpendicular to the direction of the poles of the magnet 590 with respect to the receiving hole 580 to recognize a signal, and no or little magnetic field E as generated from the magnet 590 may thus be delivered to the second sensor unit 562. For example, the path of high-density magnetic flux lines in the magnetic field E generated from the magnet 590 is not directed towards the second sensor unit 562 or some of low-density magnetic flux lines may be delivered to the second sensor unit 562. In this case, a relatively weak magnetic field E may be generated around the second sensor unit 562 as compared with the magnetic field around the magnet 590, and the second sensor unit 562 may output a third signal.

According to an embodiment of the present disclosure, information about the first signal outputted from the first sensor unit 561 may be delivered to the printed circuit part 550, and information about the third signal outputted from the second sensor unit 562 may be delivered to the printed circuit part 550. The controller 555 of the electronic device 500 may recognize, based on the first signal and/or the third signal, that the input module 530 is not normally seated in the housing 510 and determine whether the electronic device 500 operates. Whether the input module 530 is seated in the receiving hole 580 may exactly be sensed by the sensing operation of the plurality of sensor units, e.g., the first sensor unit 561 and the second sensor unit 562.

FIG. 9B shows a state of the input module 530 being completely inserted into the receiving hole 580 of the housing 510. According to an embodiment of the present disclosure, a magnetic field E generated from the magnet 590 may be partially blocked by the ferrite core 533 inside the input module 530 and delivered to the first sensor unit 561. For example, the ferrite core 533 may absorb (or be magnetized by) the magnetic field E generated by the magnet 590. A weak magnetic field E may be generated around the first sensor unit 561. Accordingly, the first sensor unit 561 may fail to sense the weakened magnetic field E and output a second signal. The second signal may be a relatively high-output signal as compared with the first signal.

According to an embodiment of the present disclosure, a magnetic field E generated from the magnet 590 may be redirected by the ferrite core 533 inside the input module 530 and delivered to the first sensor unit 562. For example, the ferrite core 533 may redirect the magnetic field E generated from the magnet 590, and a relatively strong magnetic field E may be generated around the second sensor unit 562 as compared with when the input module 530 is received. The second sensor unit 562 may sense the strengthened magnetic field E, outputting a fourth signal. The fourth signal may be a relatively low-output signal as compared with the second signal.

Information about the second signal outputted from the first sensor unit 561 and information about the fourth signal outputted from the second sensor unit 562 may be transferred to the printed circuit part 550. The controller 555 of the electronic device 500 may recognize, based on the second signal and/or the fourth signal, that the input module 530 is normally seated inside the receiving hole 580 and determine whether the electronic device 500 operates. Whether the input module 530 is seated in the receiving hole 580 may exactly be sensed by the sensing operation of the plurality of sensor units, e.g., the first sensor unit 561 and the second sensor unit 562.

Figure 10:
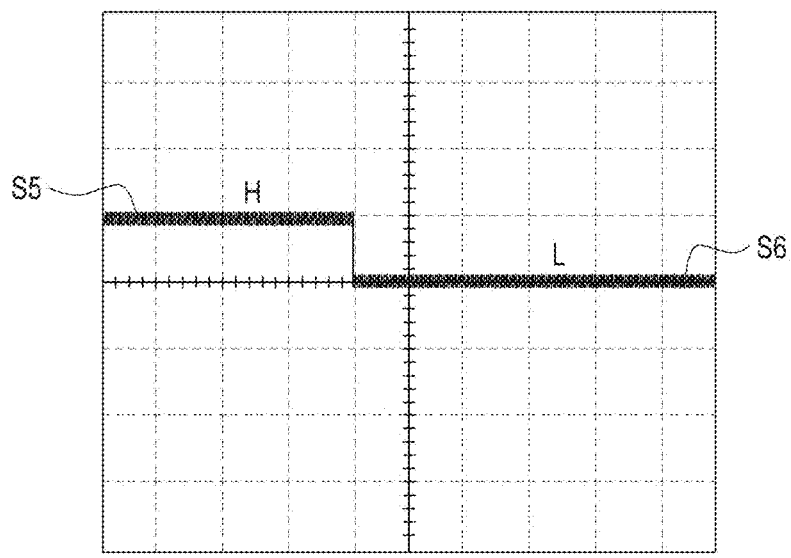
FIG. 10 is a graph of a signal output from a second sensor unit depending on insertion of an input module into a receiving hole as shown in FIGS. 9A and 9B.

FIG. 10 is a graph of a signal output from the second sensor unit 562 depending on insertion of the input module 530 into the receiving hole 580 as shown in FIGS. 9A and 9B.

Referring to FIG. 10, a process may be identified in which an output signal from the second sensor unit 562 is converted from a fifth signal S5 to a sixth signal S6. For example, the fifth signal S5 may be a signal of a wavelength generated in the state shown in FIG. 9A, and the sixth signal S6 may be a signal of a wavelength generated in the state shown in FIG. 9B.

According to an embodiment of the present disclosure, the second sensor unit 562 is not disposed on the path of the magnetic field E generated from the magnet 590, or the second sensor unit 562 may be disposed on the path of weak magnetic flux lines of the magnetic field E (refer to FIG. 9A). Accordingly, no or a weak magnetic field E is delivered to the second sensor unit 562, and the fifth signal S5 may be outputted accordingly.

According to an embodiment of the present disclosure, a magnetic field E generated from the magnet 590 may be magnetized by the ferrite core 533 disposed inside the input module 530, and the magnetic field E of which the path of the magnetic flux lines has been changed may then be transferred to the second sensor unit 562 (refer to FIG. 9B). Thus, a magnetic field E having a higher density of magnetic flux lines than that shown in FIG. 9A may be delivered to the second sensor unit 562, and the sixth signal S6 may thus be outputted. The sixth signal S6 may be a relatively low-output signal as compared with the fifth signal S5.

Figure 11A:
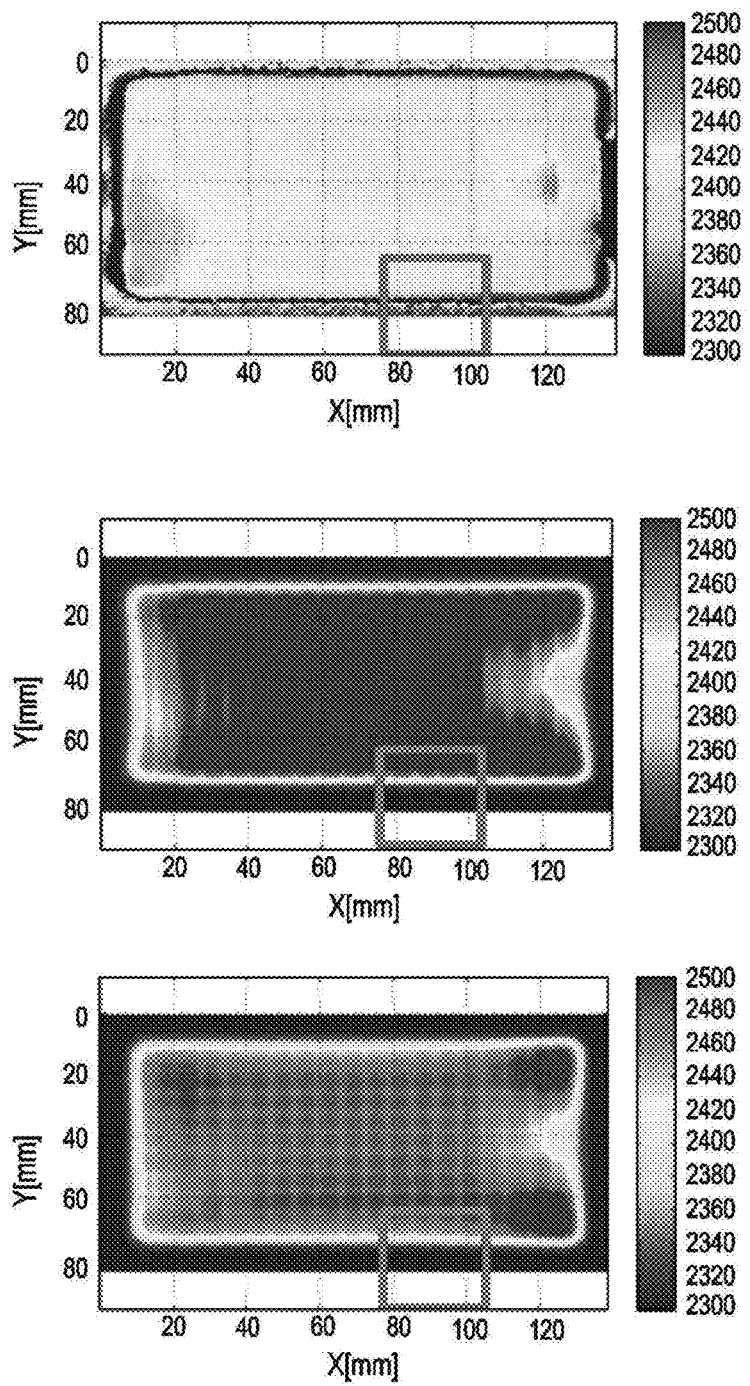
FIGS. 11A and 11B are graphs of influence on recognition of whether an input module, e.g., a digitizer, is inserted into an electronic device according to an embodiment of the present disclosure.
Figure 11B:
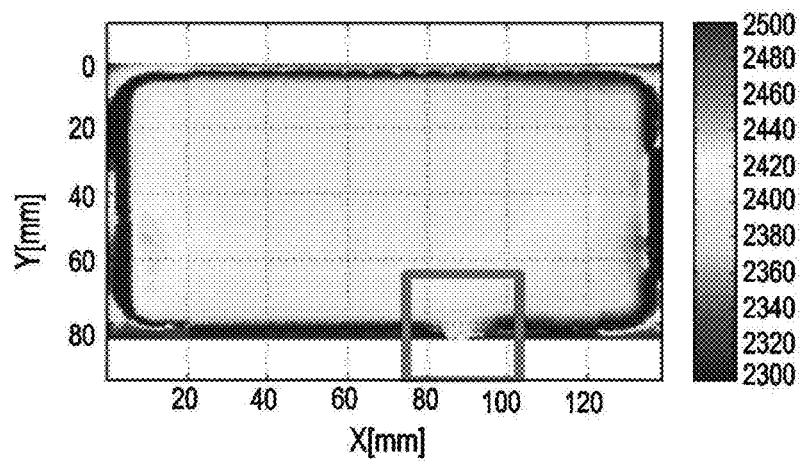
Figure 11B:
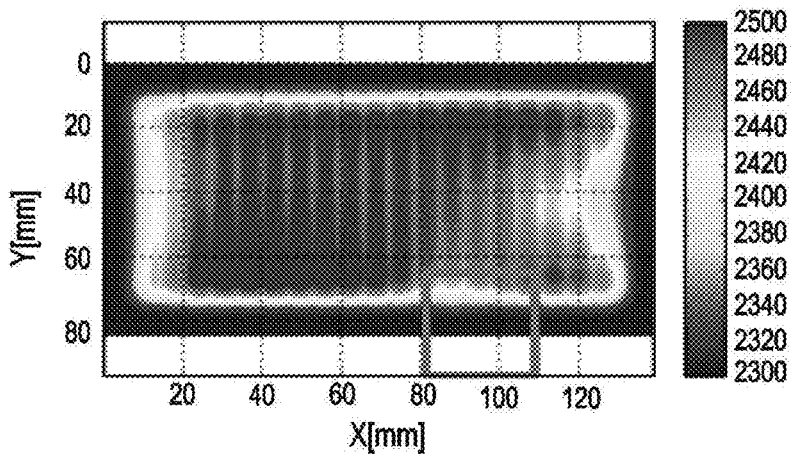
Figure 11B:
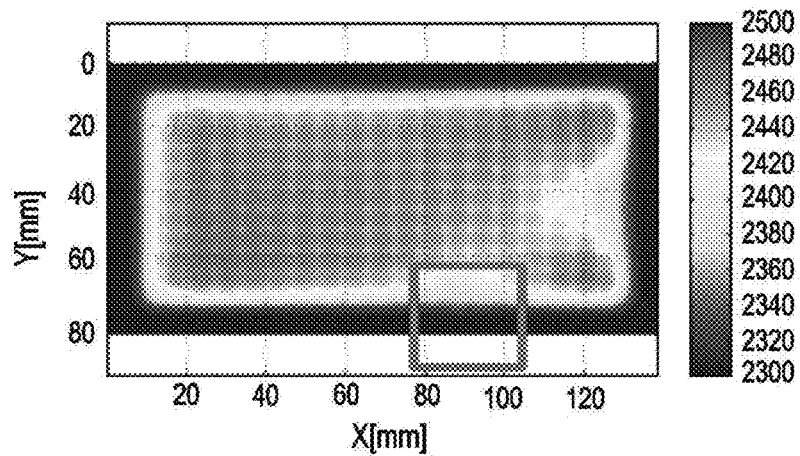

FIGS. 11A and 11B are illustrations of influence on recognition of whether an input module, e.g., a digitizer, is inserted into an electronic device according to an embodiment of the present disclosure.

Referring to FIGS. 11A and 11B, FIG. 11A shows an example of influence on the digitizer before an embodiment of the present disclosure applies, and FIG. 11B shows an example of influence on the digitizer when an embodiment of the present disclosure applies. The upper graphs of FIGS. 11A and 11B, show phases when the digitizer operates, and the middle and lower graphs show maximum signals on the x and y axes when the digitizer operates. The configurations of FIGS. 2A, 2B, and 3 may apply to the configurations of FIGS. 11A and 11B, according to an embodiment of the present disclosure.

According to an embodiment of the present disclosure, the magnet disposed inside the housing 210 may influence the digitizer in which case entry by the input module to the display screen may not work. In the case of FIG. 11B, as compared with FIG. 11A, a slight tweak (denoted in a box) may occur due to the magnet included in the housing, but its level is negligible, and this can be mitigated by firmware tuning.

Accordingly, the electronic device of the present disclosure may not only exactly present an indication as to whether the input module 230 is received or removed from the housing and stably perform the operation of the input module 230 to the display of the electronic device 200.

Figure 12:
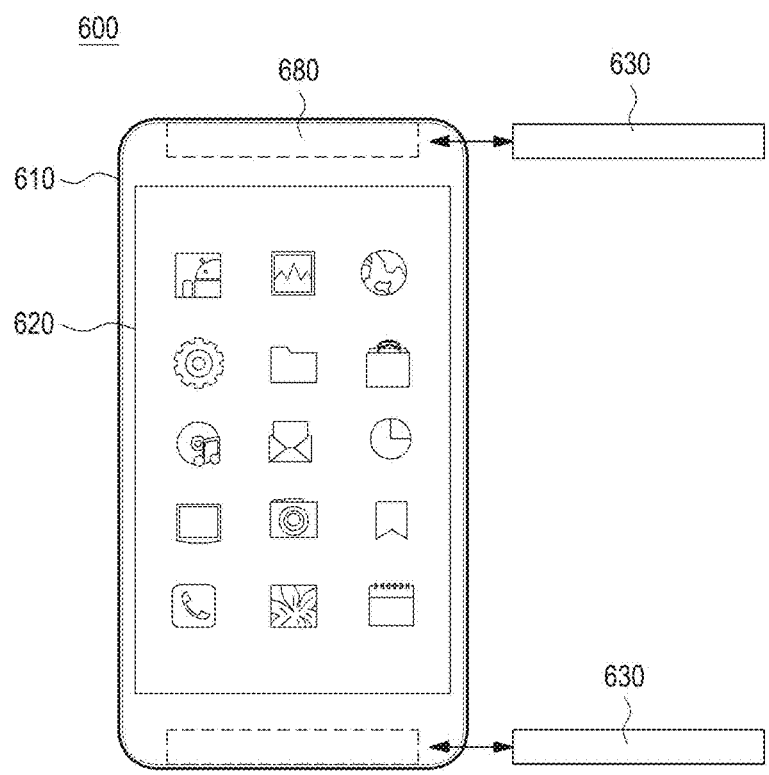
FIG. 12 is an illustration of positions where an input module may be inserted in a housing of an electronic device according to an embodiment of the present disclosure.
Figure 13A:
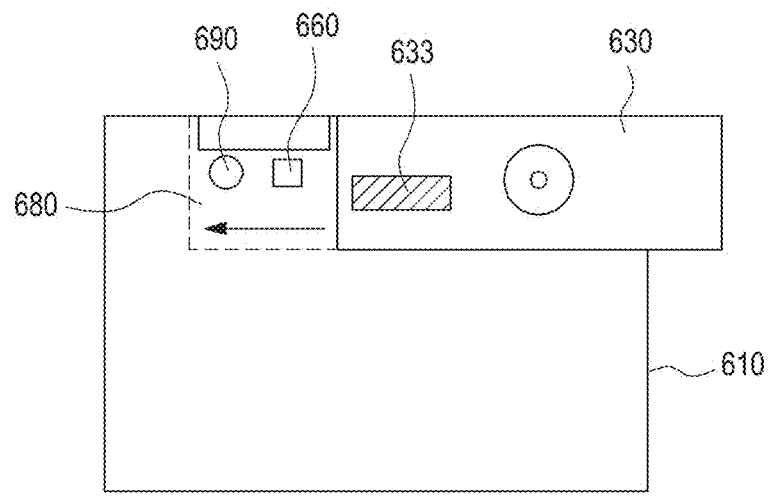
FIGS. 13A and 13B are illustrations of recognizing insertion of a camera module into a housing of an electronic device according to an embodiment of the present disclosure.
Figure 13B:
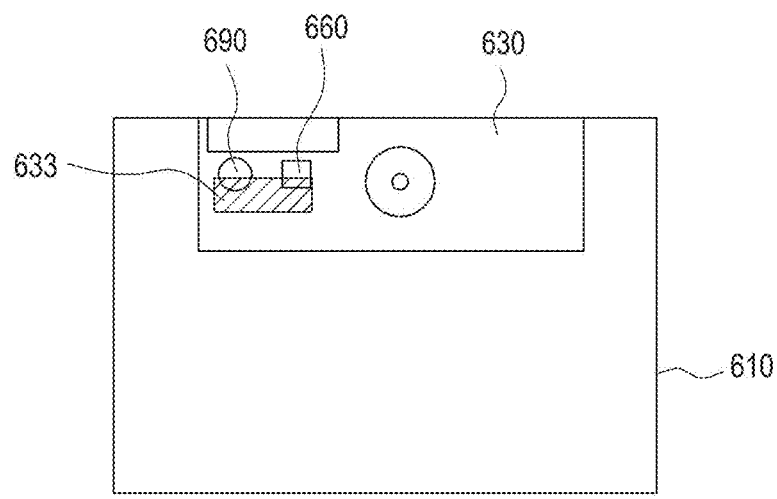

FIG. 12 is an illustration of positions where an input module 630 may be inserted in a housing 610 of an electronic device 600 according to an embodiment of the present disclosure. FIGS. 13A and 13B are illustrations of recognizing insertion of the input module 630 into the housing 610 of the electronic device 600 according to an embodiment of the present disclosure.

Referring to FIGS. 12, 13A, and 13B, FIG. 13A shows a state (not seated in position yet) of the input module 630 being inserted into the housing 610, and FIG. 13B shows a state of the input module 630 being fully received in the housing 610.

According to an embodiment of the present disclosure, the housing 610, the display device 620 and the input module 630 of FIG. 12 may be the housing 210, the display device 220 and the input module 230, respectively, of FIGS. 2A, 2B, and 3. The electronic device 600 may include the housing 610 including at least one receiving hole 680, and a magnet 690 and a sensor unit 660 arranged inside the housing 610 and mounted adjacent to the receiving hole 680.

The electronic device 600 may also include the input module 630 that may be inserted and mounted through the receiving hole 680 in the housing 610. According to an embodiment of the present disclosure, the input module 630 may be a camera module.

According to an embodiment of the present disclosure, the housing 610 may include an opening 610 exposed to the outside and the receiving hole 680 disposed in an upper or lower portion of the housing 610. The receiving hole 680 may provide a space for receiving the camera module 630.

According to an embodiment of the present disclosure, the magnet 690 may be utilized as a means to sense whether the camera module 630 is received or not. For example, the housing 610 may embed a sensor (e.g., a Hall effect sensor) for sensing a magnetic field. The sensor may sense whether the camera module 630 is received or not by sensing the magnetic field which is formed by the magnet 690.

According to an embodiment of the present disclosure, the magnet 690 may be disposed adjacent to the receiving hole 680. For example, the magnet 690 may be disposed in a position facing a ferrite core 633 embedded in the camera module 690 seated in the receiving hole 680.

According to an embodiment of the present disclosure, the electronic device 600 may include a sensor unit 660 electrically connected with a printed circuit part. The sensor unit 660 may be a Hall effect sensor and may be disposed facing the magnet 690. As the sensor unit 660 senses a magnetic field E generated by the magnet 690, whether the camera module 630 is received or not may be detected. Information detected through the sensor unit 660 may be delivered to the printed circuit part.

FIG. 13A shows a state of the camera module 630 being inserted but not fully received inside the receiving hole 680 of the housing 610. The magnet 690 may be disposed in parallel with the sensor unit 660. A wall may be formed between the magnet 690 and the sensor unit 660 to block magnetic fields. Thus, a magnetic field generated from the magnet 690 may not be directly delivered to the sensor unit 660. For example, a path of high-density magnetic flux lines from the magnet 690 is not directed towards the sensor unit 660 or some low-density magnetic flux lines may be delivered to the sensor unit 660. In this case, a relatively weak magnetic field E may be generated around the sensor unit 660 as compared with a magnetic field around the magnet 690, and the sensor unit 660 may output a signal according to the low magnetic field E. Information about the signal outputted from the sensor unit 660 may be transferred to the printed circuit part. The electronic device 600 may recognize that the camera module 630 is not normally received in the housing 610 and determine whether the electronic device 600 operates. For example, image information through the camera module 630 may fail to work with the display device, so that the mode of the camera module 630 may be maintained or switched into an inactive state.

FIG. 13B shows a state of the camera module 630 being completely inserted into the receiving hole 680 of the housing 610. A magnetic field E generated from the magnet 690 may be redirected in the path of the magnetic flux lines by the ferrite core 633 in the camera module 630 and may be delivered to the sensor unit 660.

For example, the ferrite core 633 may redirect the magnetic field E generated from the magnet 690 in a different direction and provide a path allowing the magnetic field E generated from the magnet 690 to be delivered to the sensor unit 660. Part of the magnetic field redirected by the magnetized ferrite core 633 may be delivered to the sensor unit 660. In this case, a relatively strong magnetic field may be formed around the sensor unit 600 as compared with the magnetic field E delivered to the sensor unit 660 as shown in FIG. 13A, and the sensor unit 660 may sense the strong magnetic field E and output another signal. The signal from the sensor unit 660 as shown in FIG. 13B may be a relatively low-output signal as compared with the signal from the sensor unit 660 as shown in FIG. 13A.

According to an embodiment of the present disclosure, information about the signal outputted from the sensor unit 660 may be transferred to the printed circuit part. The electronic device 600 may recognize, based on the signal, that the camera module 630 is normally seated in the housing 680 and determine whether the electronic device 600 operates. For example, image information through the camera module 630 may work with the display device, so that the mode of the electronic device 600 and/or the camera module 630 may be maintained or switched into an active state.

According to an embodiment of the present disclosure, an electronic device including an input module may include a housing including at least one receiving hole exposed to an outside, a magnet disposed inside the housing and adjacent to the at least one receiving hole, an input module insertable into the at least one receiving hole and including a ferrite core to block or redirect part of a magnetic field generated from the magnet, a sensor unit disposed inside the housing to sense the magnetic field generated from the magnet, and a controller sensing whether the input module is inserted corresponding to a signal according to a strength of the magnetic field sensed by the sensor unit.

According to an embodiment of the present disclosure, when the input module is seated in the receiving hole, the ferrite core may be disposed on a path along which the magnetic field is delivered from the magnet to the sensor unit.

According to an embodiment of the present disclosure, the sensor unit of the electronic device may be disposed adjacent to the ferrite core, and wherein the sensor unit senses a magnetic field varied by the ferrite core which is magnetized to output a signal, and the sensor unit may deliver the output signal to the controller.

According to an embodiment of the present disclosure, the magnet and the sensor unit may be disposed facing each other with the receiving hole disposed therebetween, and when the input module is seated in the receiving hole, the ferrite core which is disposed inside a front end portion of the input module may be disposed in line with the magnet and the sensor unit.

According to an embodiment of the present disclosure, the magnet may be disposed in a first direction of the receiving hole, and the sensor unit may be disposed in a second direction perpendicular to the first direction with respect to the receiving hole. When the input module is seated in the receiving hole, the sensor unit may be disposed facing a lengthwise end portion of the ferrite core disposed inside the front end portion of the input module.

According to an embodiment of the present disclosure, the input module may include a stylus pen. The stylus pen may include a body receiving a circuit unit, a tip formed at an end portion of the body, and the ferrite core disposed adjacent to the tip inside the body and magnetized by the magnetic field generated from the magnet corresponding to whether the body is inserted into the receiving hole.

According to an embodiment of the present disclosure, the stylus pen may be inserted into the receiving hole in a lengthwise direction, and the ferrite core inside the stylus pen may be disposed on a path of the magnetic field generated from the magnet between the magnet and the sensor unit.

According to an embodiment of the present disclosure, the ferrite core may absorb at least part of the magnetic field generated from the magnet to reduce a density of the magnetic field around the sensor unit.

According to an embodiment of the present disclosure, while the stylus pen is not seated in the receiving hole, the sensor unit may sense a strength of the magnetic field generated from the magnet to output a first signal.

According to an embodiment of the present disclosure, while the stylus pen is seated in the receiving hole, a strength of the magnetic field generated from the magnet may be varied while the magnetic field passes through the ferrite core, and the sensor unit may sense the varied strength of magnetic field to output a second signal.

According to an embodiment of the present disclosure, the stylus pen may be inserted into the receiving hole in a lengthwise direction, and the magnet may be disposed facing a first surface of the receiving hole, and the sensor unit may be disposed facing a second surface of the receiving hole.

According to an embodiment of the present disclosure, the first surface and the second surface of the receiving hole may be perpendicular to each other.

According to an embodiment of the present disclosure, the ferrite core may change a path of the magnetic field generated from the magnet to increase a strength of the magnetic field around the sensor unit.

According to an embodiment of the present disclosure, while the stylus pen is not seated in the receiving hole, the sensor unit may sense a strength of the magnetic field generated from the magnet to output a third signal.

According to an embodiment of the present disclosure, while the stylus pen is seated in the receiving hole, a path of the magnetic field generated from the magnet may be varied while the magnetic field passes through the ferrite core, and the sensor unit may sense the varied path of magnetic field to output a fourth signal.

According to an embodiment of the present disclosure, the receiving hole may include a first surface disposed in a lengthwise direction of the stylus pen and a second surface disposed in a direction of an end portion of the stylus pen. The sensor unit may include a first sensor unit disposed facing the first surface in line with the magnet and a second sensor unit disposed facing the second surface.

According to an embodiment of the present disclosure, the first sensor unit and the second sensor unit may sense different strengths of magnetic fields to output different strengths of signals depending on whether the ferrite core in the stylus pen is seated on a side of the receiving hole.

According to an embodiment of the present disclosure, the input module may include a camera module. The camera module may be slid into the receiving hole, and the ferrite core in the camera module may be disposed facing the magnet or the sensor unit.

According to an embodiment of the present disclosure, the path of the magnetic field generated from the magnet may be varied while the magnetic field passes through the ferrite core, and the sensor unit may sense the varied path of magnetic field.

According to an embodiment of the present disclosure, an electronic device including an input module may include a receiving hole formed in a side of a housing, the input module insertable into the receiving hole and interworking with a magnetic field inside the housing to generate a varied magnetic field, a sensor unit sensing a strength of the varied magnetic field delivered from the ferrite core, and a controller controlling an active state of the input module corresponding to a signal sensed from the sensor unit.

As is apparent from the forgoing description, an electronic device including an input module may sense a variation in magnetic field according to the correlation between a ferrite core in the input module and a magnet in the electronic device, allowing one to check if the input module is inserted into the electronic device in an effective way.

According to an embodiment of the present disclosure, an electronic device including an input module may sense whether the input module is stably inserted into the electronic device, controlling the functions of the electronic device to be activated or deactivated according to the results sensed.

According to an embodiment of the present disclosure, an electronic device including an input module adds no further physical switch, expanding the internal space and preventing the parts from being exposed externally—resultantly effective waterproofing.

While the present disclosure has been shown and described with reference to certain embodiments thereof, it will be understood by those skilled in the art that various changes in form and detail may be made therein without departing from the scope of the present disclosure as defined by the appended claims and their equivalents.

What is claimed is:

1. An electronic device, comprising:
a housing including at least one receiving hole exposed to an outside;
a magnet disposed inside the housing and adjacent to the at least one receiving hole;
an input module configured to be insertable into the at least one receiving hole and including a ferrite core configured to block or redirect part of a magnetic field generated from the magnet;
a sensor unit disposed inside the housing and configured to sense the magnetic field generated from the magnet; and
a controller configured to sense whether the input module is inserted into the at least one receiving hole by a signal according to a strength of the magnetic field sensed by the sensor unit.

2. The electronic device of claim 1, wherein when the input module is seated in the at least one receiving hole, the ferrite core is disposed on a path along which the magnetic field is delivered from the magnet to the sensor unit.

3. The electronic device of claim 2, wherein the sensor unit is disposed adjacent to the ferrite core, and when the sensor unit senses a magnetic field varied by the ferrite core which is magnetized to output a signal, the sensor unit is further configured to deliver the output signal to the controller.

4. The electronic device of claim 3, wherein the magnet and the sensor unit are disposed facing each other with the at least one receiving hole disposed therebetween, and wherein when the input module is seated in the at least one receiving hole, the ferrite core which is disposed inside a front end portion of the input module is disposed in line with the magnet and the sensor unit.

5. The electronic device of claim 3, wherein the magnet is disposed in a first direction of the at least one receiving hole, and the sensor unit is disposed in a second direction perpendicular to the first direction with respect to the at least one receiving hole, and when the input module is seated in the at least one receiving hole, the sensor unit is disposed facing a lengthwise end portion of the ferrite core disposed inside the front end portion of the input module.

6. The electronic device of claim 1, wherein the input module includes a stylus pen, wherein the stylus pen includes a body configured to receive a circuit unit, a tip formed at an end portion of the body, and the ferrite core disposed adjacent to the tip inside the body and configured to be magnetized by the magnetic field generated from the magnet corresponding to whether the body is inserted into the at least one receiving hole.

7. The electronic device of claim 6, wherein the stylus pen is insertable into the at least one receiving hole in a lengthwise direction, and wherein the ferrite core inside the stylus pen is disposed on a path of the magnetic field generated from the magnet between the magnet and the sensor unit.

8. The electronic device of claim 7, wherein the ferrite core is configured to absorb at least part of the magnetic field generated from the magnet to reduce a density of the magnetic field around the sensor unit.

9. The electronic device of claim 8, wherein when the stylus pen is not seated in the at least one receiving hole, the sensor unit is configured to sense a strength of the magnetic field generated from the magnet to output a first signal.

10. The electronic device of claim 8, wherein when the stylus pen is seated in the at least one receiving hole, a strength of the magnetic field generated from the magnet is varied while the magnetic field passes through the ferrite core, and wherein the sensor unit is further configured to sense the varied strength of magnetic field to output a second signal.

11. The electronic device of claim 6, wherein the stylus pen is configured to be insertable into the at least one receiving hole in a lengthwise direction, and wherein the magnet is disposed facing a first surface of the at least one receiving hole, and the sensor unit is disposed facing a second surface of the at least one receiving hole.

12. The electronic device of claim 11, wherein the first surface and the second surface of the at least one receiving hole are perpendicular to each other.

13. The electronic device of claim 6, wherein the ferrite core is configured to change a path of the magnetic field generated from the magnet to increase a strength of the magnetic field around the sensor unit.

14. The electronic device of claim 13, wherein when the stylus pen is not seated in the at least one receiving hole, the sensor unit is configured to sense the strength of the magnetic field generated from the magnet to output a third signal.

15. The electronic device of claim 13, wherein when the stylus pen is seated in the at least one receiving hole, the path of the magnetic field generated from the magnet is varied while the magnetic field passes through the ferrite core, and wherein the sensor unit is further configured to sense the varied path of magnetic field to output a fourth signal.

16. The electronic device of claim 1, wherein the at least one receiving hole includes a first surface disposed in a lengthwise direction of a stylus pen and a second surface disposed in a direction of an end portion of the stylus pen, and wherein the sensor unit includes a first sensor unit disposed facing the first surface in line with the magnet and a second sensor unit disposed facing the second surface.

17. The electronic device of claim 16, wherein the first sensor unit and the second sensor unit are configured to sense different strengths of magnetic fields to output different strengths of signals depending on whether a ferrite core in the stylus pen is seated on a side of the at least one receiving hole.

18. The electronic device of claim 1, wherein the input module includes a camera module, wherein the camera module is configured to slide into the at least one receiving hole, and wherein a ferrite core in the camera module is disposed facing the magnet or the sensor unit.

19. The electronic device of claim 18, wherein a path of the magnetic field generated from the magnet is varied while the magnetic field passes through the ferrite core, and wherein the sensor unit is further configures to sense the varied path of the magnetic field.

20. An electronic device including an input module, the electronic device comprising:
  a receiving hole formed in a side of a housing;
  the input module including a ferrite core and configured to be insertable into the receiving hole and to work with a magnetic field generated inside the housing to generate a varied magnetic field;
  a sensor unit configured to sense a strength of the varied magnetic field delivered from the ferrite core; and
  a controller configured to control an active state of the input module corresponding to a signal sensed from the sensor unit.

\* \* \* \* \*